US009224667B2

(12) United States Patent
Yamazaki et al.

(10) Patent No.: US 9,224,667 B2
(45) Date of Patent: *Dec. 29, 2015

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventors: Shunpei Yamazaki, Setagaya (JP); Toru Takayama, Atsugi (JP); Junya Maruyama, Ebina (JP); Yumiko Ohno, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/857,195

(22) Filed: Apr. 5, 2013

(65) Prior Publication Data

US 2013/0214434 A1 Aug. 22, 2013

Related U.S. Application Data

(62) Division of application No. 13/461,249, filed on May 1, 2012, now Pat. No. 8,415,679, which is a division of application No. 13/217,311, filed on Aug. 25, 2011, now Pat. No. 8,173,520, which is a division of (Continued)

(30) Foreign Application Priority Data

Oct. 30, 2002 (JP) ................................ 2002-316397

(51) Int. Cl.
*H01L 29/04* (2006.01)
*H01L 23/29* (2006.01)
(Continued)

(52) U.S. Cl.
CPC .......... *H01L 23/291* (2013.01); *H01L 27/1214* (2013.01); *H01L 27/1266* (2013.01);
(Continued)

(58) Field of Classification Search
CPC . H01L 27/12; H01L 27/1214; H01L 27/1266; H01L 29/66757; H01L 29/8603
USPC .............................. 257/72, 347, E31.041, 787
See application file for complete search history.

(56) References Cited

U.S. PATENT DOCUMENTS 4,722,765 A 2/1988 Ambros et al.
5,206,749 A 4/1993 Zavracky et al.
(Continued)

FOREIGN PATENT DOCUMENTS

CN 1256794 6/2000
CN 1312590 9/2001
(Continued)

OTHER PUBLICATIONS

Takayama et al., *A CPU on a Plastic Film Substrate*, 2004 Symposium on VLSI Technology, Digest of Technical Papers, Jun. 15-17, 2004, pp. 230-231.

(Continued)

*Primary Examiner* — Trung Q Dang
(74) *Attorney, Agent, or Firm* — Eric J. Robinson; Robinson Intellectual Property Law Office, P.C.

(57) ABSTRACT

It is an object of the present invention to provide a peeling method that causes no damage to a layer to be peeled and to allow not only a layer to be peeled with a small surface area but also a layer to be peeled with a large surface area to be peeled entirely. Further, it is also an object of the present invention to bond a layer to be peeled to various base materials to provide a lighter semiconductor device and a manufacturing method thereof. Particularly, it is an object to bond various elements typified by a TFT, (a thin film diode, a photoelectric conversion element comprising a PIN junction of silicon, or a silicon resistance element) to a flexible film to provide a lighter semiconductor device and a manufacturing method thereof.

17 Claims, 13 Drawing Sheets

Related U.S. Application Data application No. 13/045,560, filed on Mar. 11, 2011, now Pat. No. 8,012,854, which is a division of application No. 12/480,752, filed on Jun. 9, 2009, now Pat. No. 7,923,348, which is a division of application No. 11/713,606, filed on Mar. 5, 2007, now Pat. No. 7,547,612, which is a division of application No. 10/694,803, filed on Oct. 29, 2003, now Pat. No. 7,189,631.

(51) Int. Cl.
  H01L 27/12 (2006.01)
  H01L 29/786 (2006.01)
  H01L 51/00 (2006.01)
  H01L 29/66 (2006.01)

(52) U.S. Cl.
  CPC ........ H01L29/78603 (2013.01); H01L 51/003 (2013.01); H01L 51/0024 (2013.01); H01L 29/66757 (2013.01); H01L 2221/68368 (2013.01); H01L 2924/0002 (2013.01); Y10S 438/928 (2013.01); Y10S 438/982 (2013.01)

(56) References Cited

U.S. PATENT DOCUMENTS

| | | | |
|---|---|---|---|
| 5,258,325 A | 11/1993 | Spitzer et al. |
| 5,317,236 A | 5/1994 | Zavracky et al. |
| 5,341,015 A | 8/1994 | Kohno |
| 5,376,561 A | 12/1994 | Vu et al. |
| 5,397,713 A | 3/1995 | Hamamoto et al. |
| 5,654,811 A | 8/1997 | Spitzer et al. |
| 5,674,304 A | 10/1997 | Fukada et al. |
| 5,757,456 A | 5/1998 | Yamazaki et al. |
| 5,781,164 A | 7/1998 | Jacobsen et al. |
| 5,807,440 A | 9/1998 | Kubota et al. |
| 5,821,138 A | 10/1998 | Yamazaki et al. |
| 5,834,327 A | 11/1998 | Yamazaki et al. |
| 5,851,862 A | 12/1998 | Ohtani et al. |
| 5,879,741 A | 3/1999 | Itoh |
| 5,929,961 A | 7/1999 | Nishi et al. |
| 5,946,551 A | 8/1999 | Dimitrakopoulos et al. |
| 5,981,970 A | 11/1999 | Dimitrakopoulos et al. |
| 6,033,974 A | 3/2000 | Henley et al. |
| 6,043,800 A | 3/2000 | Spitzer et al. |
| 6,059,913 A | 5/2000 | Asmussen et al. |
| 6,100,166 A | 8/2000 | Sakaguchi et al. |
| 6,118,502 A | 9/2000 | Yamazaki et al. |
| 6,127,199 A | 10/2000 | Inoue et al. |
| 6,210,479 B1 | 4/2001 | Bojarczuk et al. |
| 6,221,738 B1 | 4/2001 | Sakaguchi et al. |
| 6,261,634 B1 | 7/2001 | Itoh |
| 6,268,695 B1 | 7/2001 | Affinito |
| 6,310,362 B1 | 10/2001 | Takemura |
| 6,320,640 B2 | 11/2001 | Nishi et al. |
| 6,339,010 B2 | 1/2002 | Sameshima |
| 6,344,660 B1 | 2/2002 | Dimitrakopoulos et al. |
| 6,344,662 B1 | 2/2002 | Dimitrakopoulos et al. |
| 6,362,866 B1 | 3/2002 | Yamazaki et al. |
| 6,372,608 B1 | 4/2002 | Shimoda et al. |
| 6,376,333 B1 | 4/2002 | Yamazaki et al. |
| 6,391,220 B1 | 5/2002 | Zhang et al. |
| 6,423,614 B1 | 7/2002 | Doyle |
| 6,426,264 B1 | 7/2002 | Kawai |
| 6,445,005 B1 * | 9/2002 | Yamazaki et al. ............... 257/72 |
| 6,448,152 B1 | 9/2002 | Henley et al. |
| 6,486,041 B2 | 11/2002 | Henley et al. |
| 6,492,026 B1 | 12/2002 | Graff et al. |
| 6,521,511 B1 | 2/2003 | Inoue et al. |
| 6,544,430 B2 | 4/2003 | McCormack et al. |
| 6,572,780 B2 | 6/2003 | McCormack et al. |
| 6,632,708 B2 | 10/2003 | Sakama et al. |
| 6,645,830 B2 | 11/2003 | Shimoda et al. |
| 6,664,169 B1 | 12/2003 | Iwasaki et al. |
| 6,682,990 B1 | 1/2004 | Iwane et al. |
| RE38,466 E | 3/2004 | Inoue et al. |
| 6,700,631 B1 | 3/2004 | Inoue et al. |
| 6,737,285 B2 | 5/2004 | Iketani et al. |
| 6,739,931 B2 | 5/2004 | Yamazaki et al. |
| 6,750,481 B2 | 6/2004 | Kawai |
| 6,753,212 B2 | 6/2004 | Yamazaki et al. |
| 6,774,010 B2 | 8/2004 | Chu et al. |
| 6,781,152 B2 | 8/2004 | Yamazaki |
| 6,784,113 B2 | 8/2004 | Hembree |
| 6,790,747 B2 | 9/2004 | Henley et al. |
| 6,802,926 B2 | 10/2004 | Mizutani et al. |
| 6,814,832 B2 | 11/2004 | Utsunomiya |
| 6,815,240 B2 | 11/2004 | Hayashi |
| 6,818,530 B2 | 11/2004 | Shimoda et al. |
| 6,849,872 B1 | 2/2005 | Yamazaki et al. |
| 6,875,671 B2 | 4/2005 | Faris |
| 6,885,389 B2 | 4/2005 | Inoue et al. |
| 6,936,846 B2 | 8/2005 | Koyama et al. |
| 6,943,369 B2 | 9/2005 | Hayashi |
| 6,946,361 B2 | 9/2005 | Takayama et al. |
| 6,953,735 B2 | 10/2005 | Yamazaki et al. |
| 6,974,731 B2 | 12/2005 | Yamazaki et al. |
| 6,995,511 B2 | 2/2006 | Yamazaki et al. |
| 6,998,282 B1 | 2/2006 | Yamazaki et al. |
| 7,045,438 B2 | 5/2006 | Yamazaki et al. |
| 7,060,153 B2 | 6/2006 | Yamazaki et al. |
| 7,094,665 B2 | 8/2006 | Shimoda et al. |
| 7,109,649 B2 | 9/2006 | Kato et al. |
| 7,119,364 B2 | 10/2006 | Yamazaki |
| 7,122,445 B2 | 10/2006 | Takayama et al. |
| 7,142,781 B2 | 11/2006 | Koyama et al. |
| 7,189,631 B2 | 3/2007 | Yamazaki et al. |
| 7,221,338 B2 | 5/2007 | Yamazaki et al. |
| 7,332,381 B2 | 2/2008 | Maruyama et al. |
| 7,335,573 B2 | 2/2008 | Takayama et al. |
| 7,351,300 B2 | 4/2008 | Takayama et al. |
| 7,361,519 B2 | 4/2008 | Yamazaki et al. |
| 7,375,782 B2 | 5/2008 | Yamazaki et al. |
| 7,425,931 B1 | 9/2008 | Yamazaki et al. |
| 7,459,849 B2 | 12/2008 | Yamazaki et al. |
| 7,514,868 B2 | 4/2009 | Yamazaki et al. |
| 7,547,612 B2 | 6/2009 | Yamazaki et al. |
| 7,855,106 B2 | 12/2010 | Yamazaki et al. |
| 7,862,677 B2 | 1/2011 | Nakajima et al. |
| 8,039,288 B2 | 10/2011 | Yamazaki |
| 8,044,588 B2 | 10/2011 | Yamazaki et al. |
| 8,415,679 B2 * | 4/2013 | Yamazaki et al. ............... 257/72 |
| 8,466,482 B2 | 6/2013 | Yamazaki |
| 2003/0032210 A1 | 2/2003 | Takayama et al. |
| 2008/0309585 A1 | 12/2008 | Yamazaki et al. |
| 2011/0086472 A1 | 4/2011 | Yamazaki et al. |
| 2011/0133635 A1 | 6/2011 | Yamazaki et al. |
| 2013/0277679 A1 | 10/2013 | Yamazaki |
| 2015/0049279 A1 | 2/2015 | Yamazaki |

FOREIGN PATENT DOCUMENTS

| | | |
|---|---|---|
| CN | 1332471 | 1/2002 |
| EP | 0 858 110 | 8/1998 |
| EP | 1 014 452 | 6/2000 |
| EP | 1 122 794 | 8/2001 |
| EP | 1148553 A | 10/2001 |
| EP | 1 351 308 | 10/2003 |
| EP | 2261978 A | 12/2010 |
| JP | 05-055582 A | 3/1993 |
| JP | 05-206468 A | 8/1993 |
| JP | 05-347186 | 12/1993 |
| JP | 06-291039 A | 10/1994 |
| JP | 08-288522 A | 11/1996 |
| JP | 10-125929 | 5/1998 |
| JP | 10-125930 | 5/1998 |
| JP | 10-125931 | 5/1998 |
| JP | 11-097357 A | 4/1999 |
| JP | 11-243209 A | 9/1999 |
| JP | 2000-150168 A | 5/2000 |
| JP | 2001-085154 | 3/2001 |
| JP | 2001-185348 A | 7/2001 |
| JP | 2001-189460 | 7/2001 |
| JP | 2001-267578 | 9/2001 |

(56) References Cited

FOREIGN PATENT DOCUMENTS

| | | |
|---|---|---|
| JP | 2001-272923 A | 10/2001 |
| JP | 2001-290439 A | 10/2001 |
| JP | 2001-331120 A | 11/2001 |
| JP | 3238223 | 12/2001 |
| JP | 2002-006777 A | 1/2002 |
| JP | 2002-033464 A | 1/2002 |
| JP | 2002-164181 A | 6/2002 |
| JP | 2002-184959 | 6/2002 |
| JP | 2002-184959 A | 6/2002 |
| JP | 2002-328624 | 11/2002 |
| JP | 2003-142666 | 5/2003 |
| JP | 2003-223992 A | 8/2003 |
| KR | 1993-0015211 A | 7/1993 |
| KR | 2001-0086116 A | 9/2001 |
| TW | 478180 | 3/2002 |
| TW | 487967 | 5/2002 |
| WO | WO 92/12453 | 7/1992 |
| WO | WO 99/44242 | 9/1999 |
| WO | WO 00/38247 | 6/2000 |

OTHER PUBLICATIONS

Office Action (Application No. 92130091) dated Mar. 9, 2009.
Korean Office Action (Application No. 2005-7006398) dated Aug. 23, 2010.
Japanese Office Action (Application No. 2014-100142) Dated Jul. 7, 2015.

\* cited by examiner

Fig.1

(A) After forming the layer to be peeled
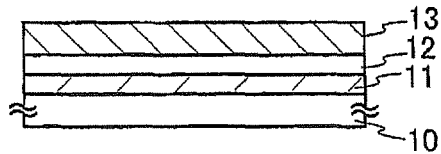

(B) The state after bonding the second substrate 15
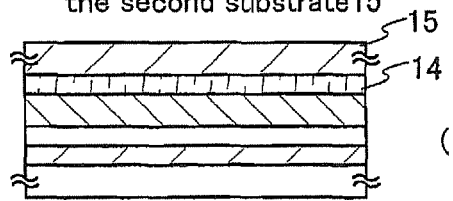

(C) The step of oxidizing the metal layer 11
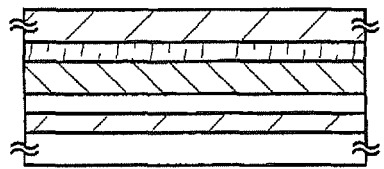

↑ light irradiation (D) The state after the step of oxidizing the metal layer 11
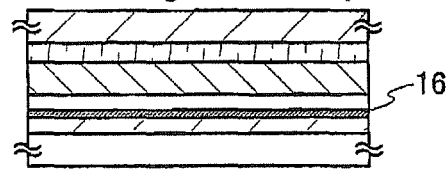

(E) The step of peeling the first substrate 10
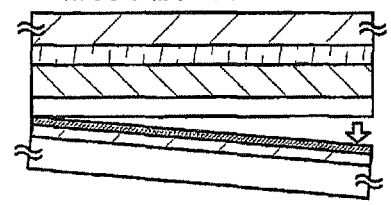

(F) The state after peeling
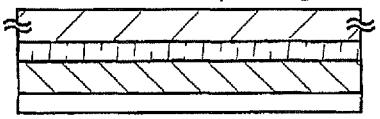

(G) The state after bonding the third substrate 18
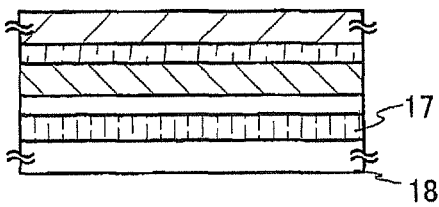

(H) The step of peeling the second substrate
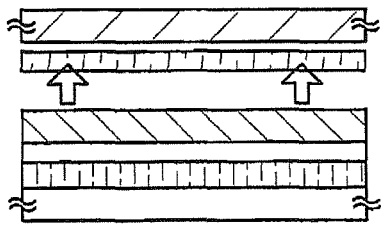

(I) The steps of forming the EL layer and bonding the fourth substrate
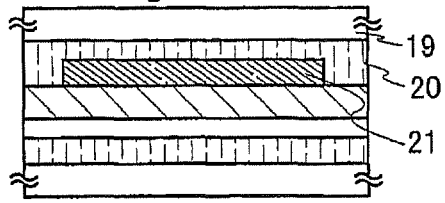

Fig.13

(A) After forming the layer to be peeled

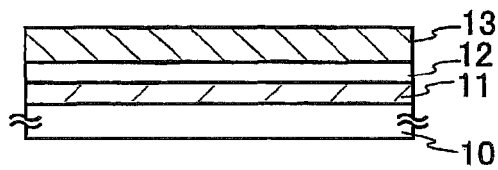

(B) The state after bonding the second substrate 15

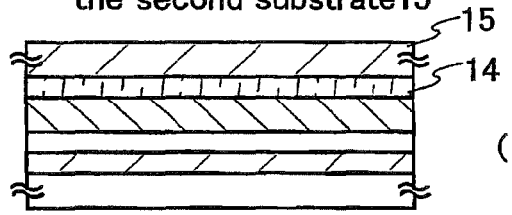

(C) The step of oxidizing the metal layer 11

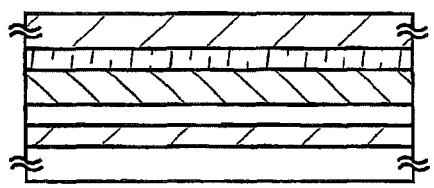

⬆ light irradiation (D) The state after the step of oxidizing the metal layer 11

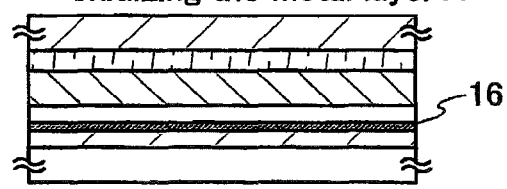

(E) The step of peeling the first substrate 10

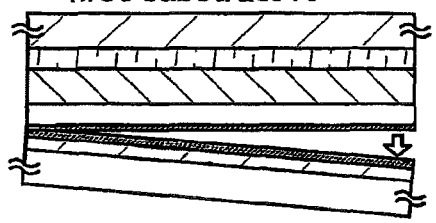

(F) The state after peeling

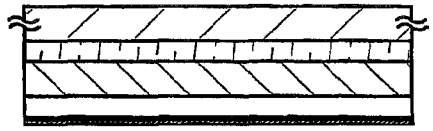

(G) The state after bonding the third substrate 18

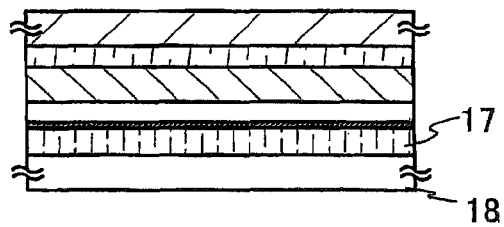

(H) The step of peeling the second substrate

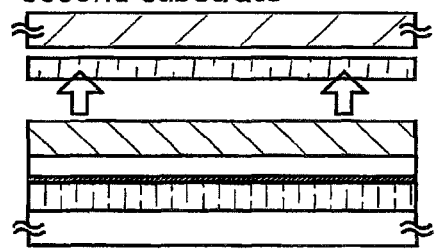

(I) The steps of forming the EL layer and bonding the fourth substrate

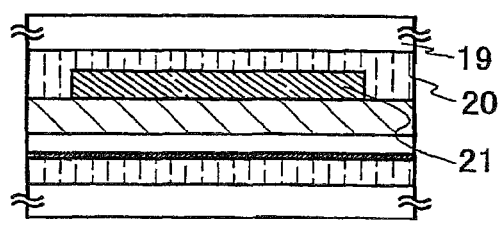

SEMICONDUCTOR DEVICE AND MANUFACTURING METHOD THEREOF

TECHNICAL FIELD

The present invention relates to a peeling method of a layer to be peeled, especially, a method for peeling a layer to be peeled including various elements. In addition, the present invention relates to a semiconductor device that has a semiconductor integrated circuit or a thin film transistor (hereinafter referred to as TFT) transferred by sticking a separated layer to be peeled to a substrate, and a manufacturing method thereof. The invention relates, for example, an electro-optical device typified by a liquid crystal module, a light-emitting device typified by an EL module, and an electronics that has such a device mounted as a component.

In the specification, the term, 'semiconductor device', generally indicates devices that are capable of functioning by utilizing semiconductor characteristics, and an electro-optical device, a light-emitting device, a semiconductor circuit, and electronics are all included in the semiconductor device.

BACKGROUND ART

Recently, attention has been paid to a technique of composing a semiconductor integrated circuit or a TFT using a semiconductor thin film on an insulating substrate such as a glass or quartz substrate. The TFT is widely applied to electronic devices such as IC and an electro-optical device, and has been rapidly developed especially as a switching element of an image display device.

There are various applications of such an image display device such as a digital video camera and a liquid crystal television, and the image display device is expected to be applied to mobile electronics such as a cellular phone, a portable game machine, a portable television, or a portable terminal especially for the future. As characteristics required by users for these mobile electronics, points of being light and being durable in order not to break when dropped, for example, are given.

However, the substrate used for the previous image display device is a substrate comprising an inorganic material such as a glass substrate or a quartz substrate, as described above, and there are defects of breaking and being heavy, which are unique to the inorganic material. In order to overcome the defects, the formation of a TFT on a substrate with plasticity, typified by a flexible plastic film, has been tried.

Compared to the substrate such as the glass or quartz substrate, however, the substrate such as the plastic film has low heat resistance, and therefore, a processing temperature in manufacturing a TFT is limited. In the result, it was difficult to manufacture a TFT directly on the plastic film, which has favorable characteristics compared to the TFT formed on the glass or quartz substrate. Consequently, a high-performance image display device or light-emitting device that uses a plastic film has not been realized.

Recently, a peeling method for peeling a layer to be peeled existing over a substrate with a separating layer interposed therebetween, has already been proposed. For example, Japanese Patent Laid-Open No. 10-125929 and Japanese Patent Laid-Open No. 10425931 describe a technique of separating a substrate by providing a separating layer of amorphous silicon (or polycrystalline silicon) and irradiating a laser beam through the substrate to release hydrogen contained in the amorphous silicon to form pores. In addition, Japanese Patent Laid-Open No. 10-125930 gives a description of sticking a layer to be peeled (in the publication, called a layer to be transferred) on a plastic layer with the use of this technique to complete a liquid crystal display device.

However, since amorphous silicon or polycrystalline silicon is used as the separating layer in the aforementioned method, a problem is considered that an irradiated laser beam is transmitted through the separating layer depending on a film thickness thereof and a wavelength of the applied laser beam to damage the layer to be peeled. Further, in the aforementioned method, in the case of forming an element on a separating layer, hydrogen contained in the separating layer is diffused and decreased when a heat treatment at a high temperature is carried out in the process of manufacturing the element. As a result, there is the possibility of insufficient peeling even if the separating layer is irradiated with a laser beam. Therefore, there is a problem that the process after forming the separating layer is limited in order to retain of the amount of hydrogen contained in the separating layer. Additionally, it is difficult to peel a layer to be peeled with a large surface according to the aforementioned method. Although the aforementioned publication gives a description of forming a light-shielding layer or a reflection layer in order to prevent the layer to be peeled from being damaged, in that case, it becomes difficult to fabricate a transmission type liquid crystal display device.

DISCLOSURE OF INVENTION

Problem to be Solved by the Invention

The present invention has been accomplished in view of the aforementioned problems, and it is an object to provide a method that enables peeling without damaging a layer to be peeled and to allow not only a layer to be peeled with a small surface area but also a layer to be peeled with a large surface area to be peeled entirely.

Further, it is also an object of the present invention to provide a lighter semiconductor device and a manufacturing method thereof by sticking a layer to be peeled on a variety of substrates. Especially, it is an object of the present invention to provide a lighter semiconductor device and a manufacturing method thereof by sticking a variety of elements typified by a TFT (a thin film diode, a photoelectric conversion element comprising PIN junction of silicon, and silicon resistor element) on a flexible film.

Means for Solving the Problem

With a large number of experiments and considerations made repeatedly, the inventors have found a method for peeling an element such as a TFT from a substrate, wherein after providing an oxide layer in contact with the metal layer provided over a substrate and further providing various elements such as a TFT on the oxide layer, the metal layer is oxidized to perform peeling completely with a physical means, typically, applying mechanical force (for example, peeling with a hand) within a metal oxide layer formed or at an interface (an interface between the metal oxide layer and the oxide layer).

Properties of a material vary greatly depending on a state of a configuration of atoms or molecules composing the material. For example, between in a crystalline state and in an amorphous state, there are differences in spectral characteristics (transmissivity, reflectivity, absorption coefficient, and the like), refractive index, and the like in optical properties, in electric conductivity in electrical properties, and in strength, hardness, density, surface energy, and the like in the other properties. Further, it is known, when a crystal lattice has different surface orientations (or orientations) in the same crystalline state, the respective properties vary depending on the respective orientation. Besides, in a thin film polycrystal formed of an aggregate of heterogeneous crystals, micro properties are different from macro properties while the macro properties are determined depending on a synthesis of parameters of properties of the respective crystals. In addition, it is natural that properties of a boundary portion between one crystal and the other crystal are different not only from the macro properties but also from the properties of the respective crystals.

To cite one example, it is known that semiconductor devices respectively using silicon in an amorphous state, a crystalline state, and a single-crystal state respectively have different optical properties, electrical properties, and the like.

In the case of providing a metal layer over a substrate, forming an oxide film on this metal layer, and further oxidizing the metal layer after completing the formation of various elements on the oxide layer according to the present invention, it is easily expected that, in terms of a micro order, metal oxide formed at the interface between the metal layer and the oxide layer is composed of an aggregate of crystals that have partially different properties and the state among the respective crystals is formed of a combination of a portion with strong cohesion and a portion with week cohesion or formed of a combination of a portion with strong bonding power and a portion with week bonding power, and it can be expected that peeling or separation can be brought by physical force.

According to the present invention, since the interface between the metal layer and the oxide layer can exist mutually in an energy state, in other words, in a bonding state within a certain range until the metal layer is oxidized, it is possible to complete a manufacturing process of an element such as a TFT safely without peeling until performing separation.

The present invention that relates to a peeling method, which is disclosed in the specification, has a peeling method of peeling a layer to be peeled from a substrate, which is a peeling method characterized in comprising:

a step of forming, over the substrate, a metal layer, an oxide layer in contact with the metal layer, and the layer to be peeled;

a step of oxidizing the metal layer to form a metal oxide layer;

a step of peeling the layer to be peeled that is bonded to the support from the substrate that has the metal layer provided with a physical means within the oxidized metal oxide layer or at an interface between the metal oxide layer and the oxide layer after bonding a support to the layer to be peeled and the oxide layer.

In the method above, the metal layer is characterized in being a single layer comprising an element selected from Ti, Ta, W, Mo, Cr, Nd, Fe, Ni, Co, Zr, and Zn, or one of an alloy material and a compound material including the element as its main component, or a lamination layer of these.

Additionally, in the method above, the oxide layer in contact with the metal layer is characterized in being a silicon oxide film formed by sputtering.

Further, the layer to be peeled is characterized in including a thin film transistor, a photoelectric conversion element comprising PIN junction of silicon, an organic light-emitting element, an element that has a liquid crystal, a memory element, a thin film diode, or silicon resistor element. However, a lowest layer of the element, which has contact with the oxide layer, may include a silicon oxide film, a silicon oxynitride film, or a silicon nitride film, or may further include a lamination layer of these.

Further, in the method above, the step of oxidizing the metal film is characterized in being conducted with irradiation of a laser beam, heat treatment, or compound treatment of irradiation of a laser beam and heat treatment.

Further, in the method above, the laser beam is a laser beam emitted from a continuous wave oscillation or pulse oscillation solid laser. Typically, as the continuous wave oscillation or pulse oscillation solid laser, there are one kind or plural kinds selected from a YAG laser, a $YVO_4$ laser, a YLF laser, a $YAlO_3$ laser, a glass laser, a ruby laser, an alexandrite laser, and a Ti:sapphire laser. In addition, as the other continuous wave oscillation or pulse oscillation laser, there are one kind or plural kinds selected from an excimer laser, an Ar laser, and a Kr laser.

Further, with respect to a direction of the irradiation of the laser beam, the laser beam may be irradiated to the metal layer form a side of the substrate, irradiated to the metal layer from the side of the layer to be peeled, or irradiated from the both sides.

Further, the laser beam may have any of a circular shape, a triangle shape, a square shape, a polygonal shape, an elliptic shape, and a linear shape, and may have any size on the order of a micron to a millimeter or a meter (may be a dot shape or planar shape). In addition, in the oxidizing process above, an irradiation region of the laser beam may have an overlap with a region irradiated most recently or may not have an overlap. In addition, it is preferable that the laser beam has a wavelength from 10 nm to 1 mm, more preferably, from 100 nm to 10 µm.

In the phenomenon caused in irradiating light such as a laser beam, the metal layer absorbs the light to generate heat, and it is believed that the generated heat energy contributes to the formation of the metal oxide layer at the interface between the metal layer and the oxide layer. In the method introduced in related art (for example, Japanese Patent Laid-Open No. 10-125929, Japanese Patent Laid-Open No. 10-125930, Japanese Patent Laid-Open No. 10-125931), in the case of forming an element that is the layer to be peeled on the separating layer that is an amorphous silicon film, hydrogen contained in the separating layer is diffused and reduced when treatment is performed at a high temperature about from 400 to 600° C. (a temperature needed for crystallization and hydrogenation of a semiconductor silicon film) in a manufacturing process the element. In this case, there is a possibility that insufficient peeling is performed in the case of irradiating the separating layer with a laser beam later in order to perform peeling. However, since there is no such trouble at all in the method according to the present invention, which enables peeling by performing oxidation treatment of the metal layer with a laser beam irradiation, the heat process during forming a peel layer is not limited.

Besides, in the method above, for the metal layer, another layer such as an insulating layer may be provided between the substrate and the metal layer. However, in order to simplify the process, it is desired to form the metal layer on the substrate in contact with the substrate.

In the case of using light such as a laser beam in the step of oxidizing the metal layer in the present method, when the direction of the irradiation of the light is made from the side of the substrate in the case where a material such as a metal layer or a metal pattern, which absorbs the light as the same level as the metal layer, exists in the layer to be peeled, it becomes possible to prevent damage without the layer to be peeled being irradiated with the light since the metal layer absorbs light in the wavelength region of at least ultraviolet light, visible light, and infrared light with low transmissivity.

Further, in the case of using the heat treatment in the step of oxidizing the metal layer in the present method, the method for the heat treatment is not limited. In particular, when RTA (Rapid Thermal Annealing) is used, the treatment can be carried out in a short time and it becomes easier to deal with an increase in the number to be processed in the case of considering mass production.

Besides, the oxidized region of the metal layer is made to be an interface between the metal layer and the oxide layer formed on the metal layer in the case of forming the metal layer in contact with the substrate while an interface between the substrate and the some layer formed between the substrate and the metal layer is additionally considered in the case of forming some layer between the substrate and the metal layer. In the latter case where it is expected that the metal oxide layer is formed at the two top and bottom interfaces the metal layer, when peeling is brought within the metal oxide layer formed between the metal layer and the some layer or at the interface of the metal oxide layer in peeling the layer to be peeled from the substrate, peeling may be carried out again thereafter to peel the metal layer from the layer to be peeled.

Another manufacturing method according to the present invention is characterized in that comprising:

a step of forming an insulator layer on a substrate, a metal layer in contact with the insulator layer, an oxide layer in contact with the metal layer, and a layer to be peeled including a semiconductor element above the oxide layer;

a step of oxidizing the metal layer to form a metal oxide layer between the metal layer and the insulating layer, between the metal layer and the oxide layer, or both between the metal layer and the insulating layer and between the metal layer and the oxide layer;

a step of peeling the layer to be peeled that is bonded to the support from the substrate with a physical means within the metal oxide layer in contact with the insulating layer, at an interface between the metal oxide layer in contact with the insulating layer and the insulating layer, at an interface between the metal oxide layer in contact with the insulating layer and the metal layer, within the metal oxide layer in contact with the oxide layer, at an interface between the metal oxide layer in contact with the oxide layer and the oxide layer, or at an interface between the metal oxide layer in contact with the oxide layer and the metal layer after bonding a support and the layer to be peeled.

In each of the methods above related to a manufacturing method, the substrate is characterized in being a glass substrate or a quartz substrate, and the support is a plastic substrate or a plastic base material.

Note that, in the specification, the physical means indicates a means that is recognized not chemically but physically. Specifically speaking, the physical means is a dynamical means or a mechanical means that has a process capable of returning to the rule of dynamics, and indicates a means for changing some dynamical energy (mechanical energy).

However, in the methods above, it is necessary that a bonding power between the oxide layer and the metal layer is set smaller than a bonding power with the support when the layer to be peeled is peeled with the physical means.

Besides, in the present invention above, it is desirable that the substrate is light-transmitting. Even in the case without being light-transmitting, there is no problem as long as light irradiation can be performed from the side of the layer to be peeled. In the case of performing light irradiation from the side of the substrate, any substrate may be used as long as light in a region absorbed by the metal layer is transmitted.

Note that, a base material described in the specification is used for bonding and fixing the layer to be peeled with, for example, an adhesive, to which the layer to be peeled is transferred. The base material has a kind that is not particularly limited, and may have any composition such as plastic, glass, metal, or ceramics. Further, in the specification, the support is used for being bonded with the layer to be peeled in peeling with the physical means. The support is not particularly limited, and may have any composition such as plastic, glass, metal, or ceramics. In addition, the base material and the support have shapes that are not particularly limited, and a shape with a planar surface, one with a curved surface, one with flexibility, or a film shape may be adopted. Further, when the highest priority is placed on weight saving of a semiconductor device, it is preferable to use a film-shaped plastic substrate as the base material, for example, a plastic substrate such as polyethylene terephthalate (PET), polyether sulfone (PES), polyethylene naphthalate (PEN), polycarbonate (PC), nylon, polyether ether ketone (PEEK), polysulfone (PSF), polyetherimide (PEI), polyarylate (PAR), polybutylene terephthalate (PBT), or polyimide.

In the methods above related to the manufacturing method of a semiconductor device, in the case of manufacturing a liquid crystal display device, the support as an opposing substrate may be bonded with the layer to be peeled with the use of a sealing material as a binding material, or a transfer to a base material may be performed after manufacturing a TFT for driving a liquid crystal element, subsequently followed by a manufacturing process of the liquid crystal element. In the former case, an element provided in the layer to be peeled has a pixel electrode, and a liquid crystal material is filled between the pixel electrode and the opposing substrate.

Further, in the methods above related to the manufacturing method of a semiconductor device, in the case of manufacturing a light-emitting device typified by a light-emitting device that has an EL element, it is preferable that the support is used as a sealing member and the light-emitting element is completely shielded from the outside to avoid a substance such as moisture or oxygen, which promotes deterioration of an organic compound layer, from penetrating from the outside. Further, when weight saving is placed at the highest priority, a film-shaped plastic substrate is preferable. However, the film-shaped plastic substrate has a little effect of avoiding the substance such as moisture or oxygen, which promotes deterioration of the organic compound layer, from penetrating from the outside. Therefore, a structure may be adopted, for example, in which a first insulating film, a second insulating film, and a third insulating film are provided on the support to avoid the substance such as moisture or oxygen, which promotes deterioration of the organic compound layer, from penetrating from the outside.

Further, in the methods above related to the manufacturing method of a semiconductor device, in another case of manufacturing a light-emitting device typified by a light-emitting device that has an EL element, a transfer to a base material may be performed after manufacturing up to a TFT for driving a light-emitting device, subsequently followed by a manufacturing process of the light-emitting device.

Besides, the present invention has a structure obtained according to the manufacturing method above of a semiconductor device, which is characterized in that a semiconductor device has a metal oxide layer in contact with an adhesive over a substrate with an insulating surface and has an element above the metal oxide layer.

In the structure above, the element is characterized in being a thin film transistor, an organic light-emitting element, an element comprising a liquid crystal, a memory element, a thin-film diode, a photoelectric conversion element comprising PIN junction of silicon, or silicon resistor element. Further, in the structure of the semiconductor device above, the substrate is characterized in being a plastic substrate with a planar surface or a curved surface. Further, in the structure above, the metal oxide layer is characterized in being formed by irradiation of a laser beam, heat treatment, or compound treatment of irradiation of a laser beam and heat treatment. Note that this metal oxide layer is formed in a peeling process.

Effect of the Invention

According to the present invention, irradiation of a laser beam, heat treatment, or compound treatment of irradiation of a laser beam and heat treatment is performed to a metal layer for performing oxidation treatment, with the result that a metal oxide layer is formed to make it possible to peel a layer to be peeled easily from a substrate with a physical means. In laser irradiation in the oxidation treatment, damage is not caused to a semiconductor layer since the laser irradiation is performed to the metal layer from the substrate side in the case of having no desire to damage the semiconductor layer.

Further, according to the present invention, it is possible to peel entirely with a high yield not only a layer to be peeled with a small area but also a layer to be peeled with a large area.

In addition, according to the present invention, peeling can be easily performed by a physical means, for example, by a human hand. Therefore, the process can be said to be appropriate for mass production. Further, in the case of manufacturing a manufacturing system for peeling a layer to be peeled in mass production, a large-scale manufacturing system can also be manufactured at low cost.

BRIEF DESCRIPTION OF DRAWINGS

FIG. 1 is a diagram showing an embodiment mode.

FIG. 13 is a diagram showing an embodiment mode.

Figure 2:
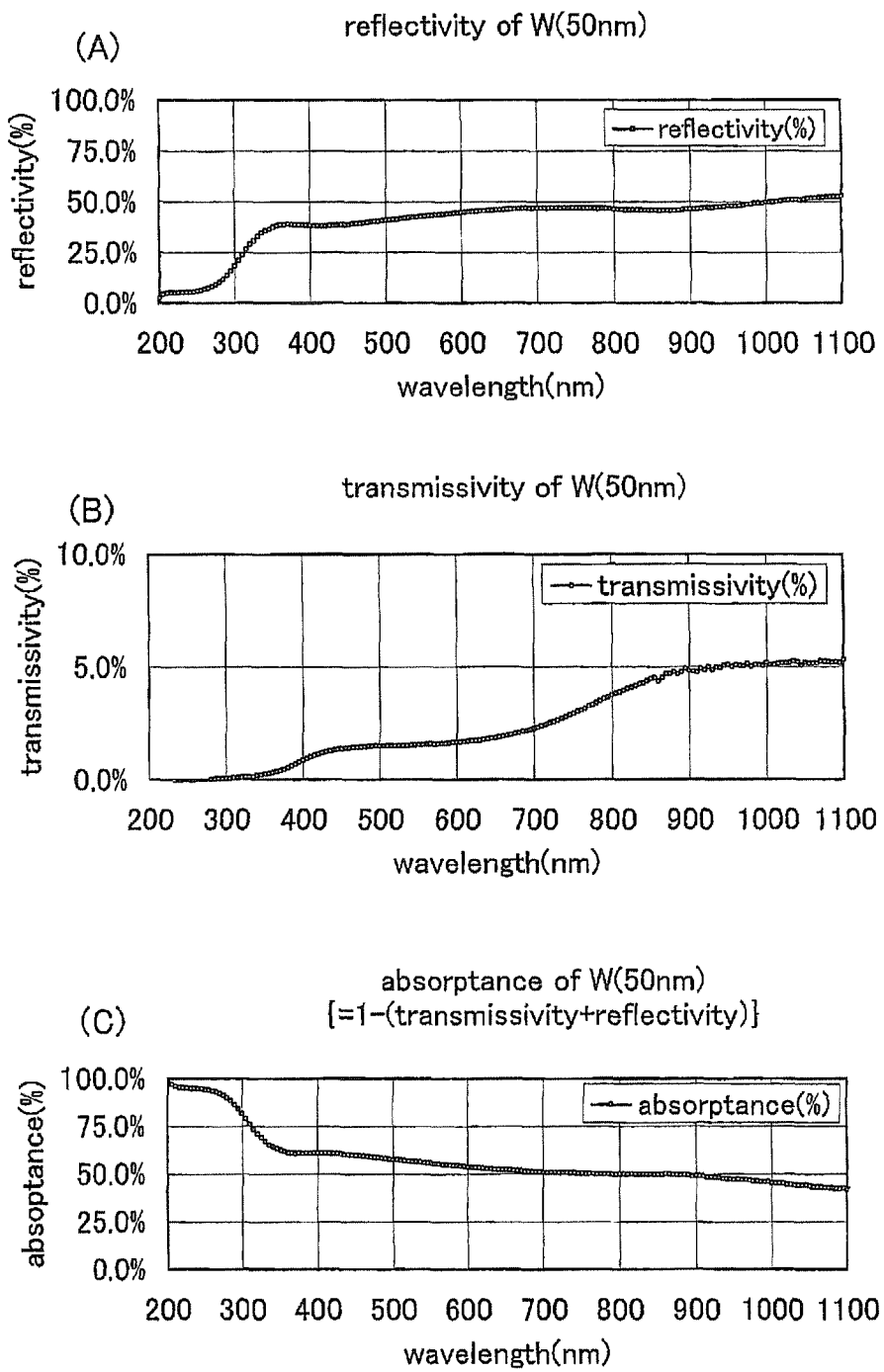
FIG. 2 is a diagram showing optical properties of a metal layer.
Figure 3:
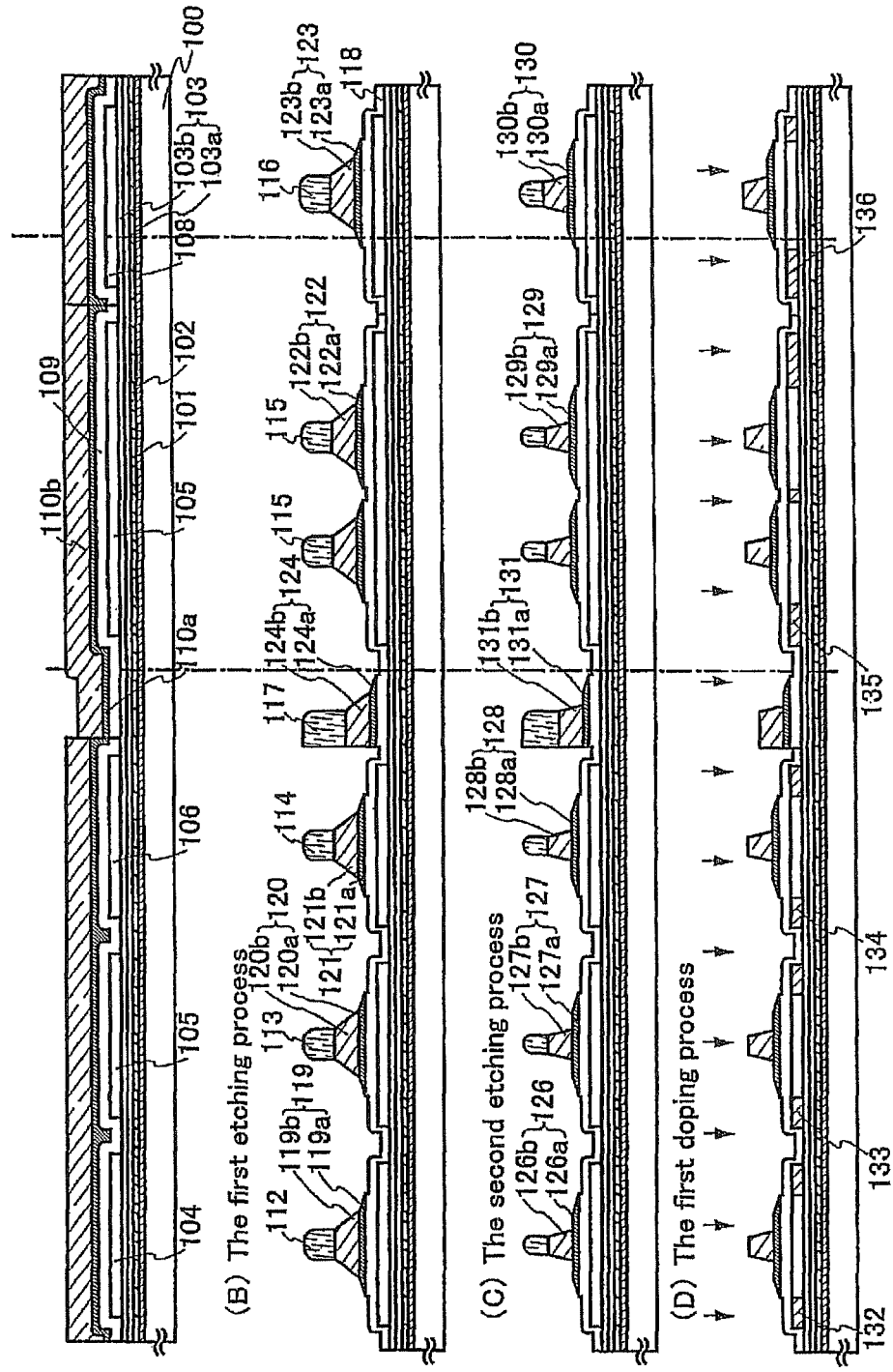
FIG. 3 is a diagram showing a manufacturing process of an active matrix substrate. (Embodiment 1)
Figure 4:
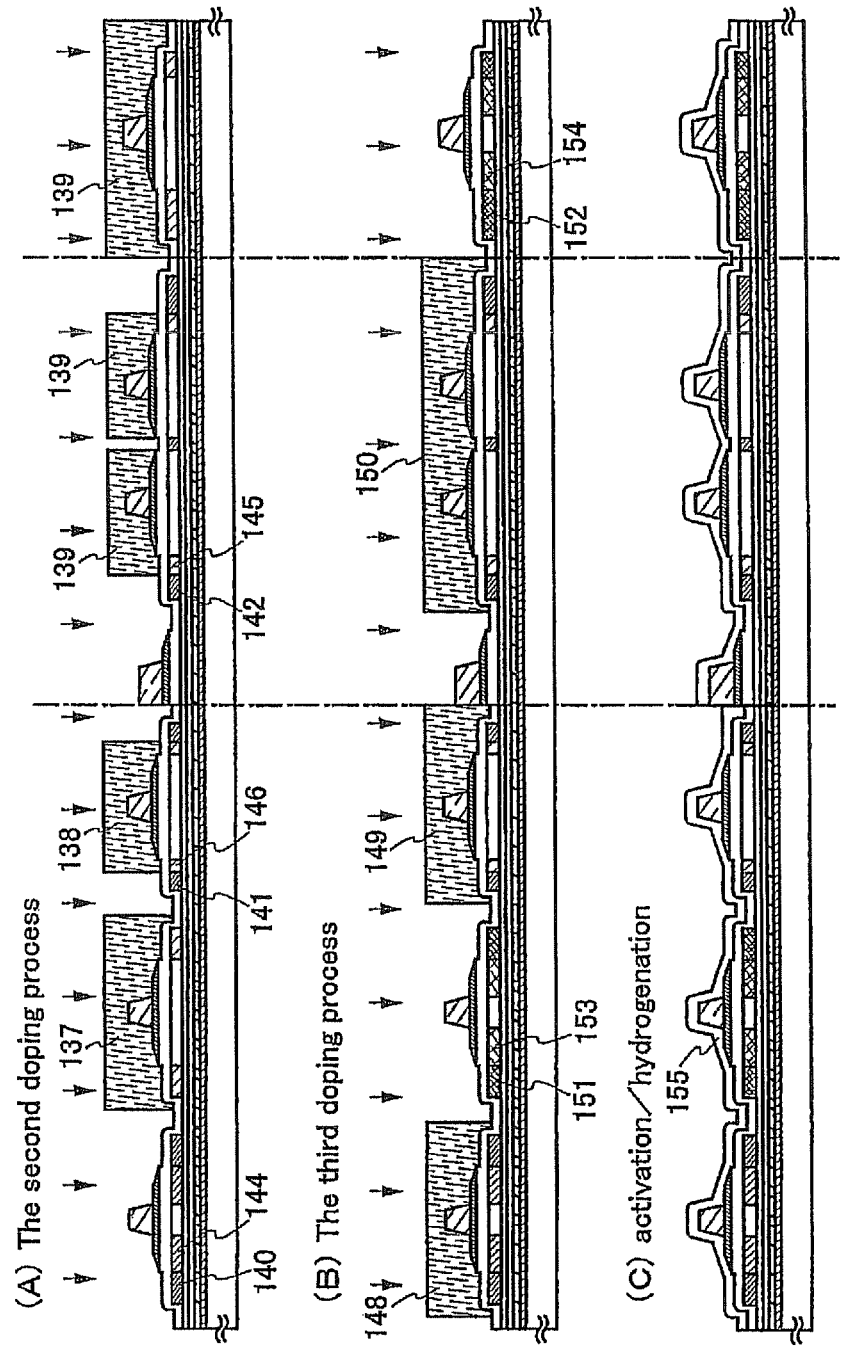
FIG. 4 is a diagram showing a manufacturing process of the active matrix substrate. (Embodiment 1)
Figure 5:
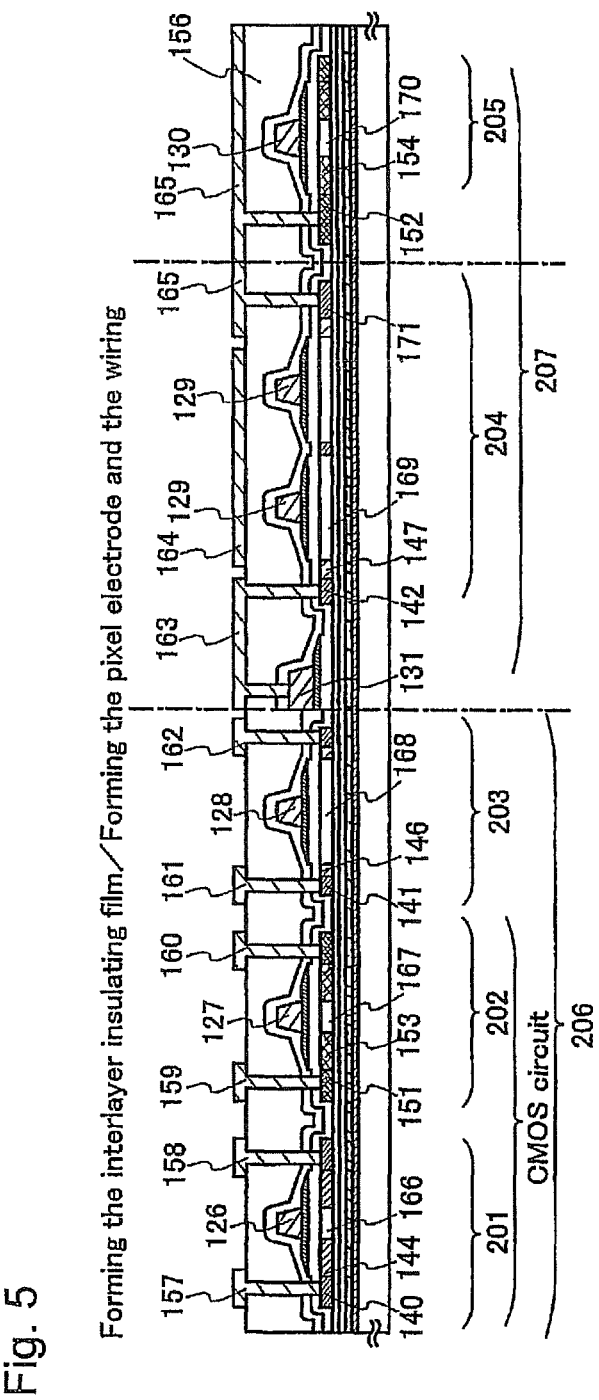
FIG. 5 is a diagram showing a manufacturing process of the active matrix substrate. (Embodiment 1)
Figure 6:
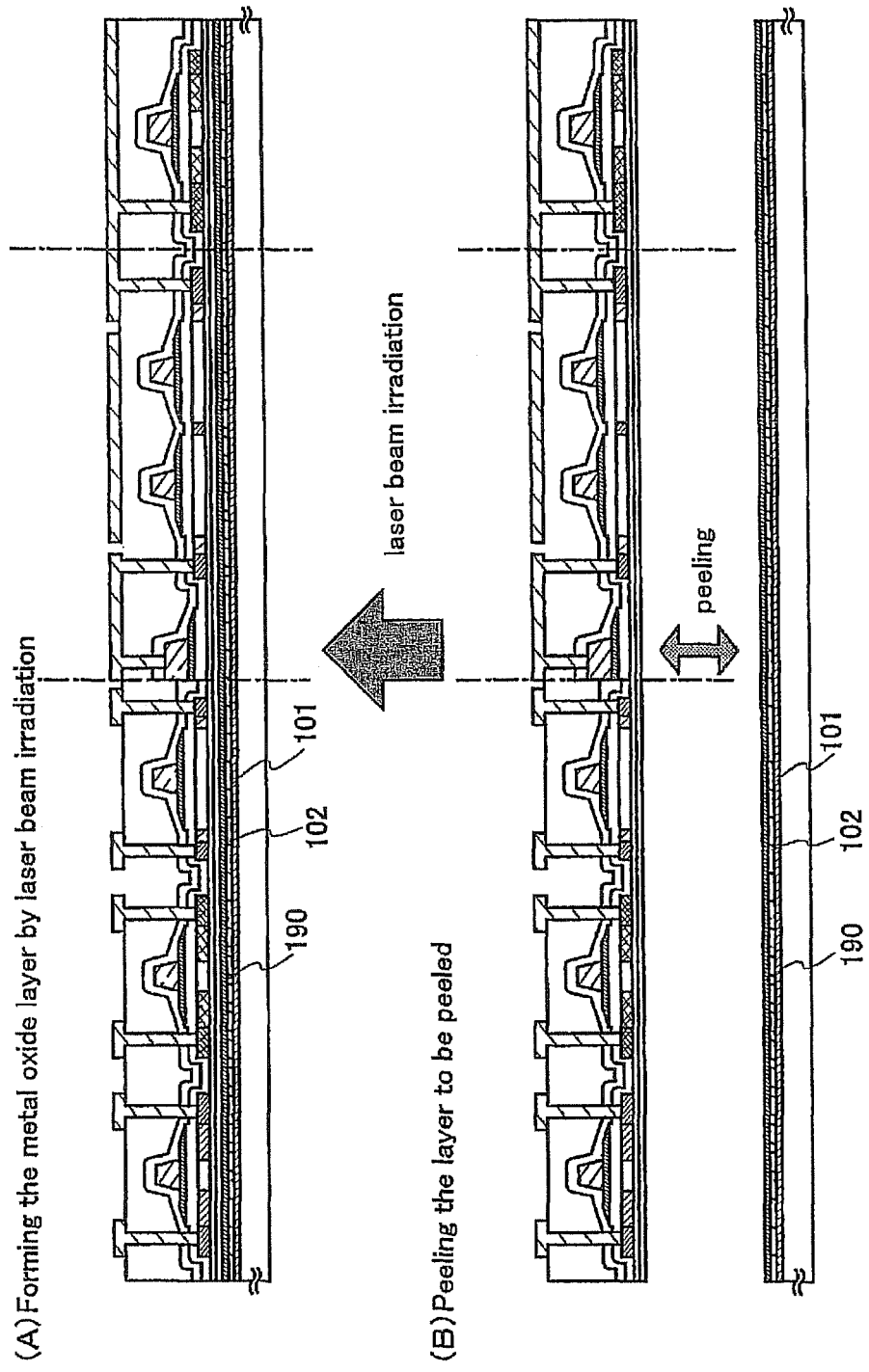
FIG. 6 is a diagram of peeling the active matrix form the substrate. (Embodiment 1)

BEST MODE FOR CARRYING OUT THE INVENTION (Embodiment Mode)

Hereinafter, an embodiment mode of the present invention will be described.

In FIG. 1(A), reference numeral 10 denotes a substrate; 11 denotes a metal layer; 12 denotes an oxide layer; and 13 denotes a layer to be peeled.

In FIG. 1(A), the substrate 10 may be any substrate as long as light in a wavelength region absorbed by the metal layer 11 is transmitted.

First, as shown in FIG. 1(A), the metal layer 11 is formed on the substrate 10. The metal layer 11 is typically a single layer comprising an element selected from W, Ti, Ta, Mo, Nd, Ni, Co, Zr, and Zn, or an alloy material or a compound material including the element as its main constituent, or is a lamination layer of these. The metal layer 11 has a thickness set at 10 nm to 200 nm, preferably 50 nm to 75 nm.

Further, a thickness in the vicinity of a peripheral portion of the substrate is likely to be uneven since the substrate is fixed in sputtering. Therefore, it is preferable to remove only the metal layer at the peripheral portion by dry etching. In this regard, an insulating film comprising a silicon oxynitride film may be formed to be a thickness of approximately 100 nm between the substrate 10 and the metal layer 11 in order to prevent the substrate from being subjected to etching.

Next, the oxide layer 12 is formed on the metal layer 11. As the oxide layer 12, silicon oxide or silicon oxynitride may be formed by sputtering to be a thickness nearly equal to or more than the metal layer, for example, from 10 nm to 600 nm, desirably, from 150 nm to 200 nm.

Then, the layer to be peeled 13 is formed on the oxide layer 12. This layer to be peeled 13 may be a layer including various elements typified by a TFT (a semiconductor device such as a thin film diode, a photoelectric conversion element comprising a PIN junction of silicon, a silicon resistance element, or a sensor element such as a pressure-sensitive fingerprint sensor).

Next, a second substrate 15, which serves as a support for fixing the layer to be peeled 13, is bonded with a first binding material 14. (FIG. 1(B)) Note that, it is preferable, as the second substrate 15, to employ a substrate with higher rigidity than that of the first substrate 10. As the first binding material 14, a general binding material, a two-sided tape, or a combination thereof may be used.

Next, oxidation treatment of the metal layer 11 is performed. Specifically, irradiation of light such as a laser beam, heat treatment, or compound treatment of irradiation of light and heat treatment is performed to oxidize the metal layer 11. In FIG. 1(C), an oxidizing process by light irradiation is shown.

A metal oxide layer 16 is formed by the oxidation treatment of the metal layer 11. (FIG. 1(D))

Then, the substrate 10 provided with metal layer 11 is peeled with a physical means. (FIG. 1(E)) What shown here is the case where it is assumed that the layer to be peeled 13 has a weak mechanical strength and the layer to be peeled 13 is broken in peeling. However, in the case where the layer to be peeled 13 has a sufficiently strong mechanical strength and the layer to be peeled 13 is not broken in peeling, the first binding material 14 and the second substrate 15 (support) are unnecessary in peeling and can be omitted.

FIG. 1(F) shows a state after peeling the layer to be peeled 13.

FIG. 1(G) shows a state in which a third substrate 18 that is a base material for transferring the layer to be peeled 13 is bonded with a second binding material 17. The third substrate 18 has a kind that is not particularly limited, which may have any composition such as plastic, glass, metal, or ceramics. In addition, the third substrate 18 has a shape that is not particularly limited, and a shape with a planar surface, one with a curved surface, one with flexibility, or a film shape may be adopted.

Next, the first binding material 14 is removed or peeled to peel the second substrate 15. (FIG. 1(F))

Then, an EL layer 21 is formed, and sealed with a fourth substrate 19 that serves as a sealing material and a third binding material 20. (FIG. 1(I)) Note that the fourth substrate 19 is not particularly required as long as the third binding material 20 has a material that is sufficiently capable of blocking a substance (moisture or oxygen) that promotes deterioration of an organic compound layer. Here, an example of manufacturing a light-emitting device that uses an EL element is shown. However, the present invention is not particularly limited to the EL element. Various semiconductor devices can be completed.

As illustrated in FIGS. 1(E) to 1(I), peeling of substrate 10 may be performed by a physical means at the interface between the metal oxide layer and the oxide layer. Alternatively, peeling may be performed by physical means applied within the metal oxide layer 16, as shown in FIG. 13(E). In this case, following the corresponding steps shown in FIGS. 13(F) to 13(I), the resulting semiconductor device includes the remaining metal oxide layer 16 in contact with second binding material 17 over third substrate 18.

In the case of manufacturing a liquid crystal display device, a support as an opposing substrate may be bonded with a layer to be peeled with the use of a sealing material as a binding material. In this case, an element provided in the layer to be peeled has a pixel electrode, and a liquid crystal material is filled between the pixel electrode and the opposing substrate. Further, the order of manufacturing the liquid crystal display device is not particularly limited. The opposing substrate as the support may be bonded, a substrate may be peeled after injecting a liquid crystal, and then, a plastic substrate as a transfer body (a base material for transferring) may be bonded. Alternatively, a substrate may be peeled after forming a pixel electrode, and an opposing substrate as a second transfer member may be bonded after bonding a plastic substrate as a first transfer body.

Also, the order of manufacturing a light-emitting device is not particularly limited. It may be that a plastic substrate as a support is bonded after forming a light-emitting element, a substrate is peeled, and a plastic substrate as a transfer body is adhered. Alternatively, it may be that a substrate is peeled after forming a light-emitting element, a plastic substrate as a first transfer body is bonded, and then, a plastic substrate as a second transfer body is bonded.

FIG. 2 shows an example of optical properties at a stage of forming a metal layer (a tungsten film: 50 nm) and an oxide layer (an silicon oxide film by sputtering: 200 nm) according to the present invention. Note that the optical properties have reflectivity and transmissivity of incident light from this glass substrate side, measured with glass as a substrate. Besides, absorptance is defined as a difference between 1 and the sum of the reflectivity and the transmissivity.

As understood from FIG. 2(B), the absorption exceeds at least about 40% while the transmissivity in the wavelength region within the measurement is less than 6%. (FIG. 2(C)) Consequently, when the metal layer is irradiated with a laser beam from the substrate side, damage is not caused to a layer to be peeled since this metal layer absorbs light energy, which is not transmitted.

(Embodiments)
[Embodiment 1]

An embodiment of the present invention will be described with reference to FIGS. 3 to 7. Here, a method for manufacturing a pixel portion and TFTs (n-channel TFTs and a p-channel TFT) of a driver circuit provided at the periphery of the pixel portion at the same time on the same substrate will be described in detail. Although an example of manufacturing an active matrix substrate for manufacturing a reflective liquid crystal display device will be shown here, there is no limitation. When an arrangement of TFTs and a material of a pixel electrode are appropriately changed, needless to say, it is also possible to manufacture a transmissive liquid crystal display device and a light-emitting device that has a light-emitting layer including an organic compound.

A glass substrate (AN100) is used as a substrate 100. First, a silicon oxynitride layer 101 is formed on the substrate with PCVD to be a thickness of 100 nm.

Subsequently, as a metal layer, a tungsten layer 102 is formed by sputtering to be a thickness of 50 nm, and without being exposed to the atmosphere, a silicon oxide layer is continuously formed by sputtering to be a thickness of 200 nm as an oxide layer 103a. The silicon oxide layer is formed under the conditions of using a sputtering system of a RF system, using a silicon oxide target (diameter: 30.5 cm), flowing heated argon gas at a flow rate of 30 sccm for heating the substrate, setting the substrate temperature at 300° C., the deposition pressure at 0.4 Pa, the deposition power at 3 kW, and argon flow rate/oxygen flow rate=10 sccm/30 sccm.

Subsequently, the tungsten layer has a portion at the periphery of the substrate or an edge removed with dry etching.

Subsequently, with plasma CVD, a silicon oxynitride film 103b (composition ratio: Si=32%, O=59%, N=7%, H=2%) manufactured from $SiH_4$ and $N_2O$ as material gas at a deposition temperature of 300° C. is formed to have a thickness of 100 nm, and further, without being exposed to an atmosphere, a semiconductor film with an amorphous structure (here, an amorphous silicon film) is continuously formed by plasma CVD at a deposition temperature of 300° C. with $SiH_4$ as deposition gas to be a thickness of 54 nm.

Then, nickel acetate salt solution containing nickel of 10 ppm by weight is applied with a spinner. Instead of the application, a method of spraying a nickel element to the entire surface with sputtering may be used. Then, heat treatment is conducted for performing crystallization to form a semiconductor film with a crystalline structure (here, a polysilicon layer). Here, after heat treatment (500° C. for 1 hour) for dehydrogenation, heat treatment (550° C. for 4 hours) for crystallization is conducted to obtain a silicon film with a crystalline structure. Note that, although the technique for crystallization is used here, which uses nickel as a metal element that promotes crystallization of silicon, the other known techniques for the crystallization, for example, solid-phase growth and laser crystallization, may be used.

Next, after removing an oxide film at a surface of the silicon film with the crystalline structure with acid such as dilute hydrofluoric acid, irradiation of a laser beam (XeCl: wavelength of 308 nm) for enhancing crystallinity and repairing defects remaining in crystal grains is performed in the atmosphere or in an oxygen atmosphere. As the laser beam, an excimer laser beam with a wavelength of 400 nm or less, or second harmonic or third harmonic of YAG laser is used. Here, a pulsed laser beam with a repetition frequency of approximately 10 to 1000 Hz is used, the pulse laser beam is condensed into 100 to 500 mJ/cm$^2$ in an optical system, and irradiation is performed with an overlap ratio of 90 to 95%, whereby the silicon film may have a surface scanned. Here, the irradiation of the laser beam is performed in the atmosphere with a repetition frequency of 30 Hz and an energy density of 470 mJ/cm$^2$. Note that an oxide film is formed on the surface due to the irradiation of the laser beam since the irradiation is carried out in the atmosphere or in an oxygen atmosphere. Though the pulsed laser is used in the example shown here, continuous oscillation laser may also be used. In crystallization of an amorphous semiconductor, it is preferable to use a solid laser that is capable of continuous oscillation and to apply the second harmonic to the fourth harmonic of a fundamental wave in order to obtain a crystal in a large grain size. Typically, the second harmonic (532 nm) or the third harmonic (355 nm) of Nd:YVO$_4$ laser (fundamental wave: 1064 nm) may be applied. In the case of using continuous oscillation laser, a laser beam emitted from continuous oscillation type YVO$_4$ laser with 10 W output is converted into a higher harmonic with a non-linear optical element. Alternatively, there is a method of putting a crystal of YVO$_4$ and non-linear optical element into a resonator to emit a harmonic. Then, preferably, a laser beams is shaped so as to have a rectangular shape or an elliptical shape with an optical system at a surface to be irradiated to irradiate an object to be processed. At this time, an energy density approximately from 0.01 to 100 MW/cm$^2$ (preferably, from 0.1 to 10 MW/cm$^2$) is required. The irradiation may be performed by moving the semiconductor film including a layer to be peeled relatively to the laser beam at a rate of approximately 10 to 2000 cm/s. Note that this laser beam is irradiated not from the substrate side but from a side of the surface of the silicon film.

In addition to the oxide film formed by the irradiation of the laser beam, the surface is treated with ozone water for 120 seconds to form a barrier layer comprising an oxide film with a thickness of 1 to 5 nm in total. Though the barrier layer is formed with ozone water in the present embodiment, an oxide film of approximately 1 to 10 nm may be deposited to form a barrier layer with another method such as irradiation of ultraviolet light in an oxygen atmosphere for oxidizing a surface of a semiconductor film with a crystalline structure, oxygen plasma treatment for oxidizing a surface of a semiconductor film with a crystalline structure, plasma CVD, sputtering, or evaporation. Further, before forming the barrier layer, the oxide film formed by the irradiation of the laser beam may be removed.

Next, on the barrier layer, an amorphous silicon film containing an argon element, which serves as a gettering site, is formed by sputtering to be a thickness of 10 to 400 nm, in this embodiment, 100 nm. In the present embodiment, the amorphous silicon film containing the argon element is formed with the use of a silicon target under an atmosphere containing argon. In the case of using plasma CVD to form an amorphous silicon film containing an argon element, deposition is performed under the condition of setting a flow ratio of monosilane to argon at 1:99, a deposition pressure at 6.665 Pa (0.05 Torr), a RF power density at 0.087 W/cm$^2$, and a deposition temperature at 350° C.

Then, a furnace heated to 650° C. is used to perform heat treatment for 3 minutes, for gettering to reduce a concentration of nickel in the semiconductor film with the crystal structure. Instead of the furnace, a lamp annealing system may be used.

Subsequently, the amorphous silicon film containing the argon element, which is the gettering site, is selectively removed with the barrier layer as an etching stopper, and then, the barrier layer is selectively removed with dilute hydrofluoric acid. Note that since nickel tends to move to a region with a high oxygen concentration in gettering, it is desirable to remove the barrier layer comprising the oxide film after gettering.

Then, after a thin oxide film is formed with ozone water on the surface of the obtained silicon film with a crystal structure (also referred to as polysilicon film), a mask comprising resist is formed, and an etching process is conducted into a desired shape to form semiconductor layers separated in an island shape. After forming the semiconductor layers, the mask comprising resist is removed.

According to the process above, it is possible to form the metal layer 102, the oxide layer 103a and the base insulating film 103b over the substrate 100, and to perform the etching process into the desired shape to form semiconductor layers 104 to 108 separated in the island shape after obtaining a semiconductor film with a crystalline structure.

Next, the oxide film is removed with an etchant containing hydrofluoric acid, and at the same time, the surface of the silicon film is cleaned. Thereafter, an insulating film including silicon as its main constituent, which serves as a gate insulating film 109, is formed. In the present embodiment, plasma CVD is used to form a silicon oxynitride film (composition ratio: Si=32%, O=59%, N=7%, H=2%) with a thickness of 115 nm.

Next, as shown in FIG. 3(A), on the gate insulating film 109, a first conductive film 110a with a thickness of 20 to 100 nm and a second conductive film 110b with a thickness of 100 to 400 nm are formed in lamination. In the present embodiment, a tantalum nitride film with a film thickness of 50 nm and a tungsten film with a film thickness of 370 nm are sequentially laminated on the gate insulating film 109.

As a conductive material for forming the first conductive film and the second conductive film, an element selected from Ta, W, Ti, Mo, Al and Cu, or an alloy material or a compound material including the element as its main constituent is formed. Further, a semiconductor film typified by a polycrystalline silicon film doped with an impurity element such as phosphorous, or an AgPdCu alloy may be used as the first conductive film and the second conductive film. Further, the present invention is not limited to a two-layered structure. For example, a tungsten film with a film thickness of 50 nm, an alloy (Al—Si) film of aluminum and silicon with a film thickness of 500 nm, and a titanium nitride film with a film thickness of 30 nm may be sequentially laminated as a three-layered structure. Moreover, in case of a three-layered structure, tungsten nitride may be used in place of tungsten of the first conductive film, an alloy film of aluminum and titanium (Al—Ti) may be used in place of the alloy film of aluminum and silicon (Al—Si) of the second conductive film, and a titanium film may be used in place of the titanium nitride film of the third conductive film. In addition, a single layer structure may also be adopted.

Next, masks 112 to 117 comprising resist are formed in accordance with an exposure process as shown in FIG. 3(B), and a first etching process is conducted for forming gate electrodes and wirings. The first etching process is conducted under first and second etching conditions. For the etching, ICP (inductively coupled plasma) etching is preferred. When ICP etching is used and the etching conditions (such as electric energy applied to a coiled electrode, electric energy applied to an electrode at the substrate side, a temperature of the electrode at the substrate side) are appropriately adjusted, the films can be etched into a desired taper shape. For etching gas, chlorine-based gas typified by Cl$_2$, BCl$_3$, SiCl$_4$, or CCl$_4$, fluorine-based gas typified by CF$_4$, SF$_6$, or NF$_3$, or O$_2$ may be appropriately used.

In the present embodiment, RF (13.56 MHz) power of 150 W is applied also to the substrate side (sample stage) to apply a substantially negative self-bias voltage. The electrode at the substrate side has an area with a size of 12.5 cm×12.5 cm, and the coiled electrode (quartz disc provided with a coil here) has an area with a size of a disc 25 cm in diameter. The W film is etched under this first etching condition so as to make an edge of the first conductive layer in a tapered shape. Under the first etching condition, an etching rate to W is 200.39 nm/min, an etching rate to TaN is 80.32 nm/min, and a selection ratio of W to TaN is about 2.5. Further, under this first etching conditions, a taper angle of W is made approximately 26°. Thereafter, the first etching condition is changed to the second etching condition without removing the masks 112 to 117 comprising resist, wherein $CF_4$ and $Cl_2$ are used as etching gas to have gas flow rates set at 30/30 (sccm) respectively, and RF (13.56 MHz) power of 500 W is applied to the coiled electrode with a pressure of 1 Pa to generate plasma for etching performed for about 30 seconds. RF (13.56 MHz) power of 20 W is applied also to the substrate side (sample stage) to apply a substantially negative self-bias voltage. Under the second etching condition in which $CF_4$ and $Cl_2$ are mixed, both the W film and the TaN film are etched at the same level. Under the second etching condition, an etching rate to W is 58.97 nm/min, and an etching rate to TaN is 66.43 nm/min. Note that it is preferable to increase etching time by approximately 10 to 20% in order to conduct etching without leaving residue on the gate insulating film.

In the first etching process as described above, the masks comprising resist have an appropriate shape, whereby the edges of the first conductive layer and the second conductive layer have a tapered shape due to an effect of the bias voltage applied to the substrate side. This tapered portion may have an angle from 15° to 45°.

Thus, first shaped conductive layers 119 to 124 composing the first conductive layer and the second conductive layer (first conductive layers 119a to 124a and second conductive layers 119b to 124b) are formed by the first etching process. The insulating film 109 that serves as a gate insulating film is etched by approximately 10 to 20 nm, and becomes a gate insulating film 118 that have a region thinned, which is not covered with the first shaped conductive layers 119 to 124.

Next, a second etching process is conducted without removing the masks comprising resist. Here, $SF_6$, $Cl_2$ and $O_2$ are used as etching gas to have gas flow rates set at 24/12/24 (sccm) respectively, and RF (13.56 MHz) power of 700 W is applied to the coiled electrode with a pressure of 1.3 Pa to generate plasma for etching performed for 25 seconds. RF (13.56 MHz) power of 10 W is applied also to the substrate side (sample stage) to apply a substantially negative self-bias voltage. In the second etching process, an etching rate to W is 227.3 nm/min, an etching rate to TaN is 32.1 nm/min, a selection ratio of W to TaN is 7.1, an etching rate to SiON that is the insulating film 118 is 33.7 nm/min, and a selection ration of W to SiON is 6.83. In the case where $SF_6$ is used as the etching gas, the selection ratio with respect to the insulating film 118 is high as described above. Thus, reduction in film thickness can be suppressed. In the present embodiment, the insulating film 118 has a film thickness reduced by only about 8 nm.

By this second etching process, the taper angle of W becomes 70°. By this second etching process, second conductive layers 126b to 131b are formed. On the other hand, the first conductive layers are hardly etched to become first conductive layers 126a to 131a. Note that the first conductive layers 126a to 131a have substantially the same size as the first conductive layers 119a to 124a. In practice, in comparison with before the second etching process, the first conductive layer may have a width reduced by approximately 0.3 µm, namely, approximately 0.6 µm to the total line width. However, there is almost no change in size of the first conductive layer.

Further, in the case where, instead of the two-layered structure, a tungsten film with a film thickness of 50 nm, an alloy film of aluminum and silicon (Al—Si) with a film thickness of 500 nm, and a titanium nitride film with a film thickness of 30 nm are sequentially laminated as a three-layered structure, etching may be performed for 117 seconds under the first etching condition in the first etching process that $BCl_3$, $Cl_2$ and $O_2$ are used as material gas to have gas flow rates set at 65/10/5 (sccm) respectively, RF (13.56 MHz) power of 300 W is applied to the substrate side (sample stage), and RF (13.56 MHz) power of 450 W is applied to the coiled electrode with a pressure of 1.2 Pa to generate plasma. Under the second etching condition in the first etching process that $CF_4$, $Cl_2$ and $O_2$ are used to have gas flow rates set at 25/25/10 (sccm) respectively, RF (13.56 MHz) power of 20 W is applied also to the substrate side (sample stage), and RF (13.56 MHz) power of 500 W is applied to the coiled electrode with a pressure of 1 Pa to generate plasma, etching may be performed for about 30 seconds. In the second etching process, etching may be performed while $BCl_3$ and $Cl_2$ are used to have gas flow rates set to 20/60 (sccm), RF (13.56 MHz) power of 100 W is applied to the substrate side (sample stage), and RF (13.56 MHz) power of 600 W is applied to the coiled electrode with a pressure of 1.2 Pa to generate plasma.

Next, the masks comprising resist are removed, and then, a first doping process is conducted to obtain a state of FIG. 3(D). The doping process may be conducted with ion doping or ion implantation. Ion doping is conducted under the conditions of a dosage set at $1.5 \times 10^{14}$ atoms/cm$^2$ and an accelerating voltage set at 60 to 100 keV. As an impurity element that imparts n-type conductivity, phosphorous (P) or arsenic (As) is typically used. In this case, the first conductive layers and second conductive layers 126 to 130 serve as masks against the impurity element that imparts n-type conductivity, and first impurity regions 132 to 136 are formed in a self-aligning manner. The first impurity regions 132 to 136 are doped with the impurity element that imparts n-type conductivity in the range of concentration from $1 \times 10^{16}$ to $1 \times 10^{17}$/cm$^3$. Here, a region that has the same range of concentration as that of the first impurity region is also called an n⁻ region.

Note that, although the first doping process is performed after removing the masks comprising resist in the present embodiment, the first doping process may be performed without removing the masks comprising resist.

Subsequently, as shown in FIG. 4(A), masks 137 to 139 comprising resist are formed and a second doping process is conducted. The mask 137 is a mask that protects a channel formation region and a periphery thereof of the semiconductor layer for forming a p-channel TFT of a driver circuit, the mask 138 is a mask for protecting a channel formation region and a periphery thereof of the semiconductor layer for forming one of n-channel TFTs of the driver circuit, and the mask 139 is a mask that protects a channel formation region and a periphery thereof of the semiconductor layer for forming a TFT of a pixel portion and a region that serves as a storage capacitor.

Under the conditions of a dosage of $1.5 \times 10^{15}$ atoms/cm$^2$ and an accelerating voltage of 60 to 100 keV in ion doping in the second doping process, doping with phosphorous (P) is performed. Here, impurity regions are formed in the respective semiconductor layers in a self-aligning manner with the second conductive layers 126b to 128b as masks. Of course, the regions covered with the masks 137 to 139 are not doped. Thus, second impurity regions 140 to 142 and a third impurity region 144 are Mimed. The second impurity regions 140 to 142 are doped with the impurity element that imparts n-type conductivity at a concentration from $1 \times 10^{20}$ to $1 \times 10^{21}$/cm$^3$. Here, a region that has the same range of concentration as that of the second impurity region is also called an n⁺ region.

Further, the third impurity region is formed to have a lower concentration than that in the second impurity region due to the first conductive layer, and is doped with the impurity element that imparts n-type conductivity at a concentration from $1\times10^{18}$ to $1\times10^{19}/cm^3$. Note that since doping is conducted while passing a portion of the first conductive layer in the tapered shape, the third impurity region has a concentration gradient in which the concentration of the impurity increases toward the edge of the tapered portion. Here, a region that has the same range of concentration as that of the third impurity region is also called an n" region. Furthermore, the regions covered with the masks 138 and 139 are not doped with the impurity element in the second doping process, and become first impurity regions 146 and 147.

Next, after removing the masks 137 to 139 comprising resist, masks 148 to 150 comprising resist are newly formed and a third doping process is conducted as shown in FIG. 4(B).

In the driver circuit, by the third doping process as described above, the semiconductor layer for forming the p-channel TFT and the semiconductor layer for forming the storage capacitor are doped with an impurity element that imparts p-type conductivity to form fourth impurity regions 151 and 152 and fifth impurity regions 153 and 154.

Further, the fourth impurity regions 151 and 152 are required to be doped with the impurity element that imparts p-type conductivity at a concentration from $1\times10^{20}$ to $1\times10^{21}/cm^3$. Note that, although the fourth impurity regions 151 and 152 are regions doped with phosphorous (P) in the previous step (n⁻ region), the third doping process is performed with the impurity element that imparts p-type conductivity at a concentration that is 1.5 to 3 times as high as that of phosphorous to have p-type conductivity. Here, a region that has the same range of concentration as that of the fourth impurity region is also called a p⁺ region.

Further, the fifth impurity regions 153 and 154 are formed in a region overlapping with the tapered portion of the second conductive layer 127a, and are required to be doped with the impurity element that imparts p-type conductivity at a concentration from $1\times10^{18}$ to $1\times10^{20}/cm^3$. Here, a region that has the same range of concentration as the fifth impurity region is also called a p⁻ region.

According to the process above, the impurity regions that have n-type or p-type conductivity are formed in the respective semiconductor layers. The conductive layers 126 to 129 serve as gate electrodes of the TFTs. Further, the conductive layer 130 serves as one of electrodes, which forms the storage capacitor in the pixel portion. Moreover, the conductive layer 131 forms a source wiring in the pixel portion.

Next, an insulating film (not shown in the figure) that covers substantially the entire surface is formed. In the present embodiment, a silicon oxide film with a film thickness of 50 nm is formed by plasma CVD. Of course, this insulating film is not limited to a silicon oxide film, and another insulating film including silicon may be used as a single layer or a laminated structure.

Then, a process of activating the impurity elements added to the respective semiconductor layers is conducted. This activation process is conducted with rapid thermal annealing (RTA) using a lamp light source, a method of irradiating a YAG laser or an excimer laser from a rear surface, heat treatment using a furnace, or a method combined with any of these methods.

Further, although the insulating film is formed before the activation in the example shown in the present embodiment, the process of forming the insulating film may be conducted after conducting the activation above.

Next, a first interlayer insulating film 155 of a silicon nitride film is formed, and heat treatment (300 to 550° C. for 1 to 12 hours) is performed to conduct a step of hydrogenating the semiconductor layers. (FIG. 4(C)) This process is a process of terminating dangling bonds of the semiconductor layers with hydrogen contained in the first interlayer insulating film 155. The semiconductor layers can be hydrogenated regardless of the existence of the insulating film (not shown in the figure) of a silicon oxide film. Incidentally, since a material including aluminum as its main constituent is used as the second conductive layer in the present embodiment, it is important to apply a heat treatment condition that the second conductive layer can withstand in the process of hydrogenation. As another means for hydrogenation, plasma hydrogenation (using hydrogen excited by plasma) may be conducted.

Next, a second interlayer insulating film 156 comprising an organic insulating material is formed on the first interlayer insulating film 155. In the embodiment, an acrylic resin film with a thickness of 1.6 μm is formed. Then, a contact hole that reaches the source wiring 131, contact holes that respectively reach the conductive layers 129 and 130, and contact holes that reach the respective impurity regions are formed. In the embodiment, a plurality of etching processes is sequentially performed. In the embodiment, after the second interlayer insluting film is etched with the first interlayer insulating film as an etching stopper, the first interlayer insulating film is etched with the insulating film (not shown in the figure) as an etching stopper and the insulating film (not shown in the figure) is etched.

Thereafter, a material such as Al, Ti, Mo, or W is used to form a wiring and a pixel electrode. As the material of the electrode and pixel electrode, it is desirable to use a material with excellent reflectivity, such as a film including Al or Ag as its main constituent or a laminated film thereof. Thus, source electrodes or drain electrodes 157 to 162, a gate wiring 164, a connecting wiring 163, and a pixel electrode 165 are formed.

As described above, a driver circuit 206 that has an n-channel TFT 201, a p-channel TFT 202, and an n-channel TFT 203 and a pixel portion 207 that has a pixel TFT 204 comprising an n-channel TFT and a storage capacitor 205 can be formed on the same substrate. (FIG. 5) In the specification, such a substrate is called an active matrix substrate for the sake of convenience.

In the pixel portion 207, the pixel TFT 204 (n-channel TFT) has a channel formation region 169, the first impurity region (n⁻ region) 147 formed outside the conductive layer 129 forming the gate electrode, and the second impurity regions (n⁺ region) 142 and 171 that function as a source region or a drain region. Further, in the semiconductor layer that functions as one of the electrodes of the storage capacitor 205, the fourth impurity region 152 and the fifth impurity region 154 are formed. The storage capacitor 205 is formed of the second electrode 130 and the semiconductor layers 152, 154, and 170 with the insulating film (the same film as the gate insulating film) 118 as a dielectric.

Further, in the driver circuit 206, the n-channel TFT 201 (first n-channel TFT) has a channel formation region 166, the third impurity region (n⁻ region) 144 that overlaps with a part of the conductive layer 126 forming the gate electrode through the insulating film, and the second impurity region (n⁺ region) 140 that functions as a source region or a drain region.

Further, in the driver circuit 206, the p-channel TFT 202 has a channel formation region 167, the fifth impurity region (p⁻ region) 153 that overlaps with a part of the conductive layer 127 forming the gate electrode through the insulating film, and the fourth impurity region (p⁺ region) 151 that functions as a source region or a drain region.

Furthermore, in the driver circuit 206, the n-channel TFT 203 (second n-channel TFT) has a channel formation region 168, the first impurity region (n⁻ region) 146 outside the conductive layer 128 forming the gate electrode, and the second impurity region (n⁺ region) 141 that functions as a source region or a drain region.

These TFTs 201 to 203 are appropriately combined to form a shift resister circuit, a buffer circuit, a level shifter circuit, a latch circuit and the like to form the driver circuit 206. For example, in the case of forming a CMOS circuit, the n-channel TFT 201 and the p-channel TFT 202 may be complementarily connected to each other.

In particular, the structure of the n-channel TFT 203 is appropriate for the buffer circuit with a high driving voltage in the purpose of preventing deterioration due to a hot carrier effect.

Moreover, the structure of the n-channel TFT 201, which is a GOLD structure, is appropriate for the circuit where top priority is placed on reliability.

Besides, reliability can be improved by improving flatness of the surface of the semiconductor film. Thus, in the TFT with the GOLD structure, sufficient reliability can be obtained even if the impurity region that overlaps with the gate electrode through the gate insulating film has an area reduced. Specifically, in the TFT with the GOLD structure, sufficient reliability can be obtained even if the portion that serves as the tapered portion of the gate electrode has a size reduced.

In the TFT with the GOLD structure, a parasitic capacitance increases when the gate insulating film is thinned. However, when the portion that serves as the tapered portion of the gate electrode (first conductive layer) has a size reduced to reduce the parasitic capacitance, the TFT has f-characteristic (frequency characteristic) improved to enable a further high-speed operation and has sufficient reliability.

Note that, also in the TFTs of the pixel portion 207, reduction in OFF current and variation can be realized by irradiation of a second laser beam.

Further, an example of manufacturing an active matrix substrate for forming a reflective display device is shown in the embodiment. However, when the pixel electrode is formed of a transparent conductive film, a transmissive display device can be formed although the number of photomasks is increased by one.

After forming the display device, the metal layer 102 is irradiated with a continuous or pulsed laser beam from a side of the substrate to generate heat for performing oxidation treatment, and a metal oxide layer 190 is formed between the metal layer 102 and the oxide layer 103a (FIG. 6(A)). It becomes thereby possible to peel the layer to be peeled from the substrate (FIG. 6(B)). For the laser light irradiated at this time, an Nd:YAG laser (fundamental wave: 1064 nm) is used with an output of 40 W. With respect to the wavelength region, however, a laser beam in any region may be used, as shown in FIG. 2. Besides, the irradiation of the laser beam may have a timing that is not limited to the timing after making up the display device, but the laser beam may be irradiated in the step where peeling of the layer to be peeled is desired. Additionally, as for a beam shape of the laser beam, a linear continuous wave is used this time. However, the beam shape is not limited to this, and may be any of circular, elliptic, triangle, square, and polygonal shapes and may be any of spot and planar shapes. Further, although the process of oxidizing the metal layer is conducted with irradiation of the laser beam, oxidation treatment using heat treatment may be employed.

When the layer including the TFTs (the layer to be peeled), which is provided on the oxide layer 103a, has a sufficient mechanical strength after obtaining the state of FIG. 6(A), the substrate 100 may be taken off. In the present embodiment, it is preferable to perform laser irradiation and peeling after bonding a support (not shown in the figure) for fixing the layer to be peeled since the layer to be peeled has an insufficient mechanical strength.

Figure 7:
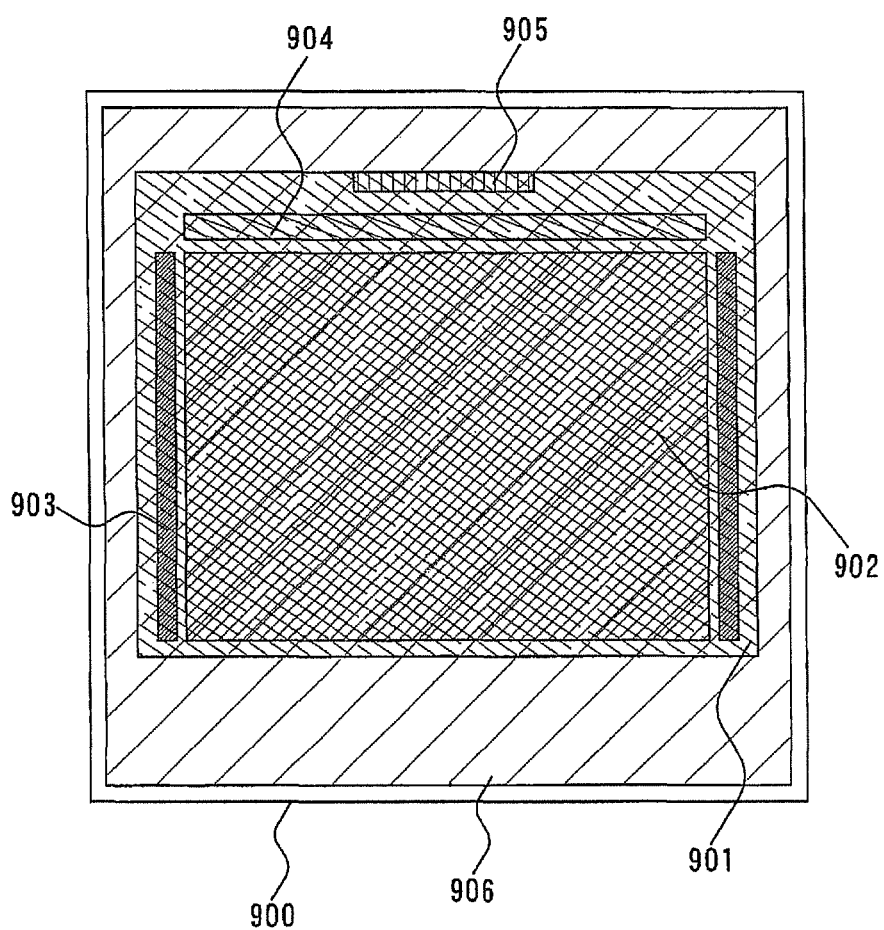
FIG. 7 is a diagram showing a light-irradiation region in performing oxidation treatment of a metal layer. (Embodiment 1)

In performing the oxidation treatment of the metal element using light, a region 906 including a display device 901 (including a pixel portion 902, a gate driver portion 903, a source driver portion 904, and an FPC terminal portion 905) on a substrate 900 may be irradiated with a laser beam, as shown in FIG. 7.

[Embodiment 2]

Figure 8:
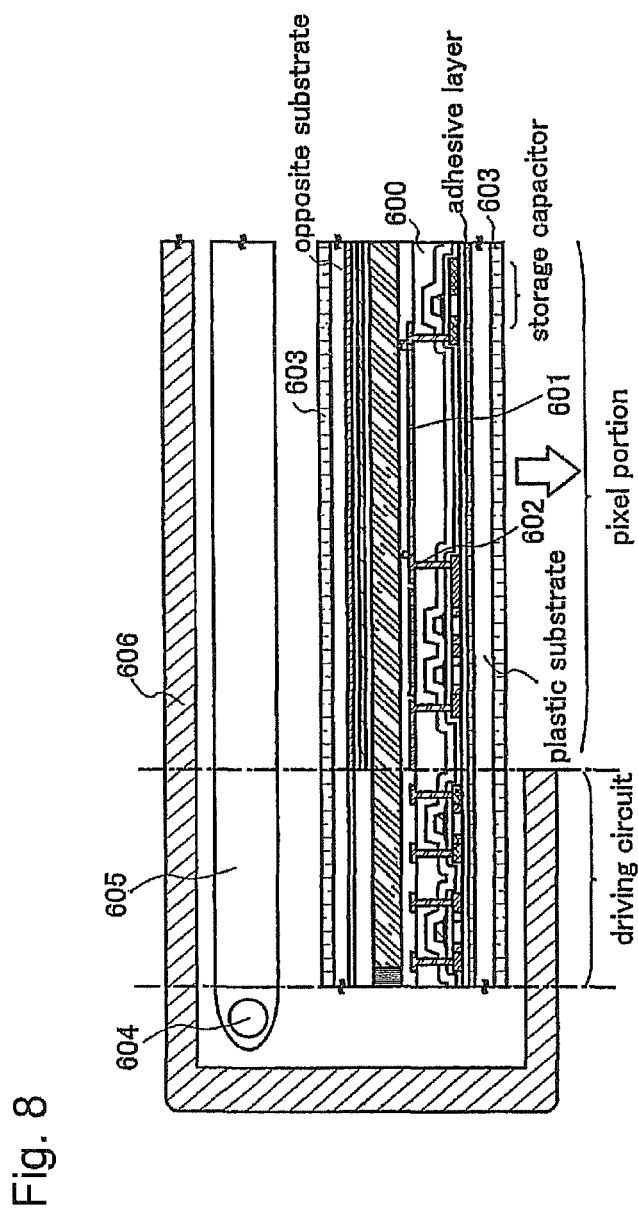
FIG. 8 is a diagram showing a sectional view of a liquid crystal display device. (Embodiment 2)

Embodiment 1 shows an example of a reflective display device in which a pixel electrode is formed of a reflective metal material. In the present embodiment, an example of a transmissive display device, in which a pixel electrode is formed of a light-transmitting conductive film, is shown in FIG. 8.

Since processes up to the step of forming an interlayer insulating film are the same as those of Embodiment 1, the description thereof is omitted here. After forming the interlayer insulating film in accordance with Embodiment 1, a pixel electrode 601 of a light-transmitting conductive film is formed. As the conductive film with transmittance, ITO (indium tin oxide alloy), indium oxide-zinc oxide alloy ($In_2O_3$—$ZnO$), zinc oxide ($ZnO$) film, and the like may be used.

Thereafter, contact holes are formed in an interlayer insulating film 600. Then, a connecting electrode 602 overlapping with the pixel electrode is formed. This connecting electrode 602 is connected to a drain region through the contact hole. Further, at the same time as this connecting electrode, source electrodes or drain electrodes of other TFTs are also formed.

Although all of the driver circuits are formed on the substrate in the example shown here, several ICs may be used for a part of the driver circuits.

In this way, an active matrix substrate is formed. With the use of this active matrix substrate, a base material (a plastic substrate) is bonded after peeling the TFTs to manufacture a liquid crystal module. Further, when the liquid crystal module is provided with a backlight 606 and a light guiding plate 605 and is covered with a cover 606 to complete an active matrix liquid crystal display device that has a partial sectional view shown in FIG. 8. The cover and the liquid crystal module are bonded with an adhesive or organic resin. Besides, in bonding the plastic substrate and an opposite substrate, the substrates may be surrounded with a frame and the space between the frame and the substrates may be filled with organic resin for bonding. Since the active matrix liquid crystal display device is of a transmissive type, a polarizing plate 603 is bonded to both of the plastic substrate and the opposite substrate.

[Embodiment 3]

Figure 9:
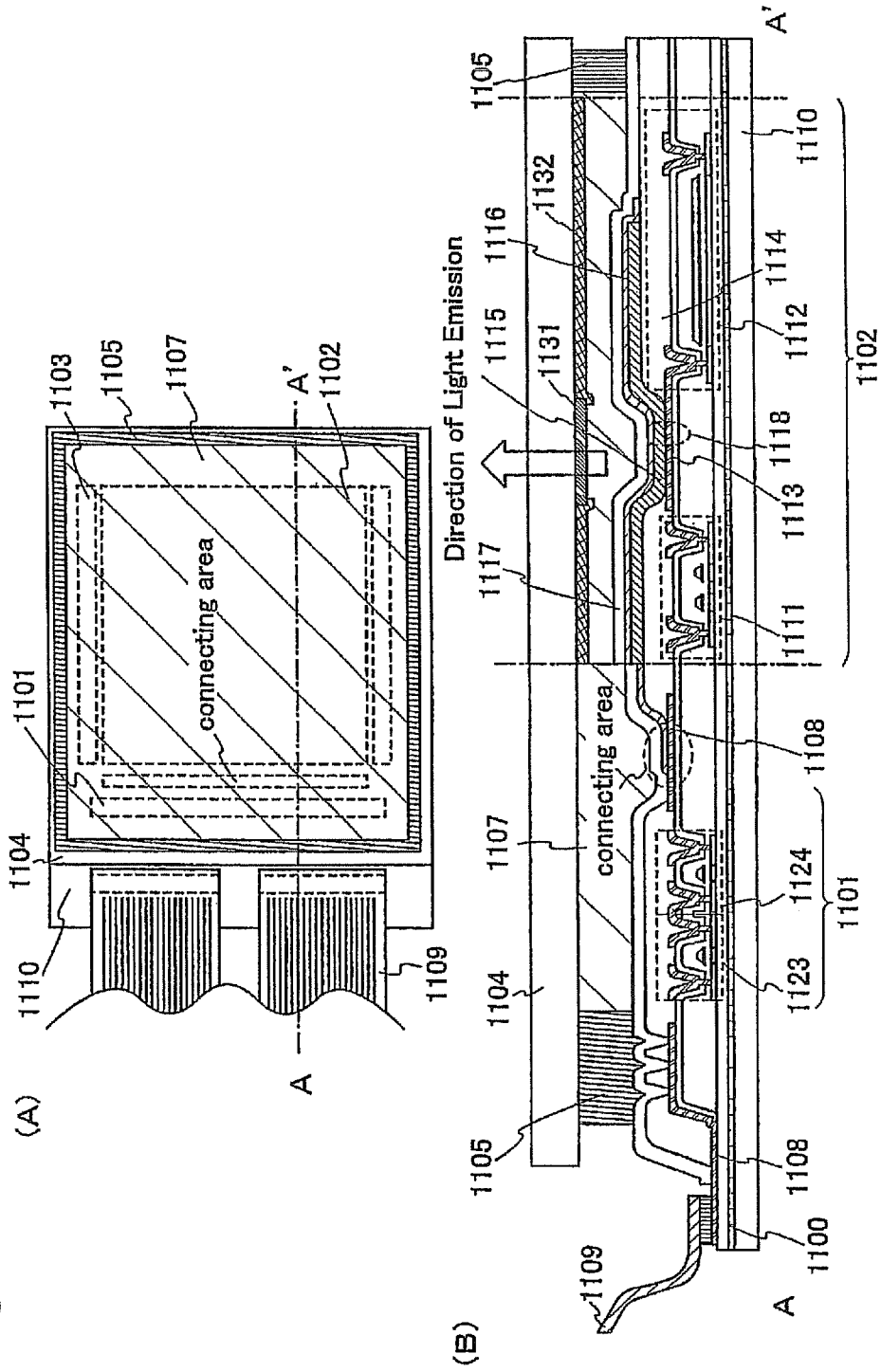
FIG. 9 is a diagram showing a top view or a sectional view of a light-emitting device. (Embodiment 3)

In the present embodiment, an example for manufacturing a light-emitting device equipped with a light-emitting element that has a light-emitting layer including an organic compound, which formed on a plastic substrate will be described with reference to FIG. 9.

FIG. 9(A) is a top view that shows a light-emitting device and FIG. 9(B) is a sectional view of FIG. 9(A) taken along A-A'. A dotted line 1101 denotes a source signal line driver circuit, reference numeral 1102 denotes a pixel portion, and reference numeral 1103 denotes a gate signal line driver circuit. Reference numeral 1104 denotes a sealing substrate and reference numeral 1105 is a sealing agent. The inside surrounded by the first sealing agent 1105 is filled with a second transparent sealing material 1107.

Reference numeral 1108 is a wiring for transmitting signals to be input to the source signal line driver circuit 1101 and the gate signal line driver circuit 1103, and receives a video signal and a clock signal from a FPC (Flexible Printed Circuit) 1109 as an external input terminal. Though only the FPC is shown in the figure here, a printed wiring board (PWB) may be attached to this FPC. A light-emitting device in the specification includes not only a light-emitting device body but also a state where an FPC or a PWB is attached thereto.

Next, the sectional structure will be explained with reference to FIG. 9(B). A driver circuit and a pixel portion are formed on a substrate 1110. Here, the source signal driver circuit 1101 as the driver circuit and the pixel portion 1102 are shown. Note that, by using the peeling method described in Embodiment mode 1 or Embodiment 1, the substrate 1110 is bonded to a base film with an adhesive layer 1100.

In the source signal line driver circuit 1101, a CMOS circuit is formed of a combination of an n-channel TFT 1123 and a p-channel TFT 1124. The TFT forming the driver circuit may be formed of a known CMOS circuit, PMOS circuit, or NMOS circuit. Besides, although the present embodiment shows a driver integrated type in which a driver circuit is formed on a substrate, which is not always necessary, the driver circuit can be formed not on the substrate but at the outside thereof.

The pixel portion 1102 is formed of a plurality of pixels each including a switching TFT 1111, a current control TFT 1112, and a first electrode (anode) 1113 connected electrically to a drain of the current control TFT 1112. Note that, although an example in which two TFTs are used for one pixel is shown, three or more TFTs may be appropriately used.

Since the first electrode 1113 has contact directly with a drain of the TFT, it is preferable to use a material layer comprising silicon, which can take an ohmic contact with the drain, as the bottom layer of the first electrode 1113, and to use a material layer with a large work function at the surface of the first electrode 1113, which has a contact with a layer including an organic compound. When the first electrode is made to be a three-laminated structure, for example, a titanium nitride film, a film including aluminum as its main constituent, and a titanium nitride film, resistance as a wiring is low, and it is possible to take a favorable ohmic contact, and function as an anode. In addition, as the first electrode 1113, a single layer of a titanium nitride film or a laminated structure of two or more layers may be used.

Further, an insulator (referred to as a bank, a barrier, a blocking layer, or the like) 1114 is formed on both ends of the first electrode (anode) 1113. The insulator 1114 may be formed of an organic resin film or an insulating film including silicon. Here, as the insulator 1114, an insulator in the shape shown in FIG. 9 is formed with the use of a positive photosensitive acrylic resin film.

In order to attain a favorable coverage, it is preferable to have an upper edge portion or a lower edge portion of the insulating material 1114 formed with a curved surface that has a curvature. In the case of using a positive photosensitive acrylic resin film as a material of the insulating material 1114, for example, it is preferable to make only an upper edge portion of the insulator 1114 have a curved surface with a curvature radius (0.2 µm to 3 µm). A negative photosensitive material that becomes insoluble in an etchant under light, and a positive photosensitive material that becomes soluble in an etchant under light both can be used as the insulating material 1114.

Besides, the insulator 1114 may be covered with a protective film comprising an aluminum nitride film, an aluminum oxynitride film, or silicon nitride film. This protective film may be an insulating film including silicon nitride or silicon oxynitride as its main constituent, which is obtained with sputtering (DC system or RF system), or a thin film including carbon as its main constituent. When a silicon target is used for forming the protective film in an atmosphere containing nitride and argon, a silicon nitride film can be formed. Alternatively, a silicon nitride target may be used. The protective film may be formed with the use of a deposition system using remote plasma. It is preferable to thin the thickness of the protective film as much as possible in order to make the protective film transmit light emission.

A layer including an organic compound 1115 is selectively formed on the first electrode (anode) 1113 by evaporation that uses an evaporation mask or ink-jet. Further, a second electrode (cathode) 1116 is formed on the layer including the organic compound 1115. Consequently, a light-emitting element 1118 comprising the first electrode (anode) 1113, the layer including the organic compound film 1115, and the second electrode (cathode) 1116 is formed. Since the light-emitting element 118 emits white light in the example shown here, a color filter formed of a coloring layer 1131 and a light-shielding layer (BM) 1132 (for simplification, an overcoat layer is not shown in the figure) is provided.

When a layer including an organic compound, from which each of R, G and B emission is obtained, is selectively formed, full color display can be obtained without using a color filter.

In order to seal the light-emitting element 1118, the sealing substrate 1104 is bonded with the first sealing material 1105 and the second sealing material 1107. It is preferable to use epoxy resin as the first sealing material 1105 and the second sealing material 1107. It is also preferable that the first sealing material 1105 and the second sealing material 1107 are materials that do not transmit moisture or oxygen as much as possible.

In the present embodiment, as a material constituting the sealing substrate 1104, a plastic substrate comprising FRP (Fiberglass-Reinforced Plastics), PVF (polyvinylfluoride), Mylar, polyester, acrylic, or the like can be used besides a glass substrate and a quarts substrate. After bonding the sealing substrate 1104 with the first sealing material 1105 and the second sealing material 1107, it is also possible to perform further sealing with a third sealing material to cover a side face (exposed face).

As described above, when the light-emitting element is sealed with the first sealing material 1105 and the second sealing material 1107, the light-emitting element can be shield completely from the outside and moisture or oxygen that promotes deterioration of an organic compound layer can be prevented from penetrating from the outside. Accordingly, a light-emitting device with high reliability can be obtained.

Besides, when a transparent conductive film is used as the first electrode 1113, both-emission type light-emitting device can be manufactured.

Although, in the present embodiment, an example of a structure (hereinafter referred to as a top-emission structure), in which a layer including an organic compound is formed on an anode and a cathode that is a transparent electrode is formed on the layer including the organic compound is shown, a structure that has a light-emitting element in which an organic compound layer is formed on an anode and a cathode is formed on the organic compound layer, in which light generated in the organic compound layer is emitted through the anode that is a transparent electrode toward a TFT, (hereafter referred to as a bottom-emission structure) also may be employed.

The present embodiment can be freely combined with Embodiment Mode or Embodiment 1.

[Embodiment 4]

Embodiment 3 shows an example of manufacturing a light-emitting device equipped with a light-emitting element that has a light-emitting layer including an organic compound, which is formed on a plastic substrate. In the present embodiment, an explanation will be given more in detail on a sectional structure of one pixel of the light-emitting device, particularly, a connection of the light emitting element with a TFT, a shape of a barrier positioned between pixels.

Figure 10:
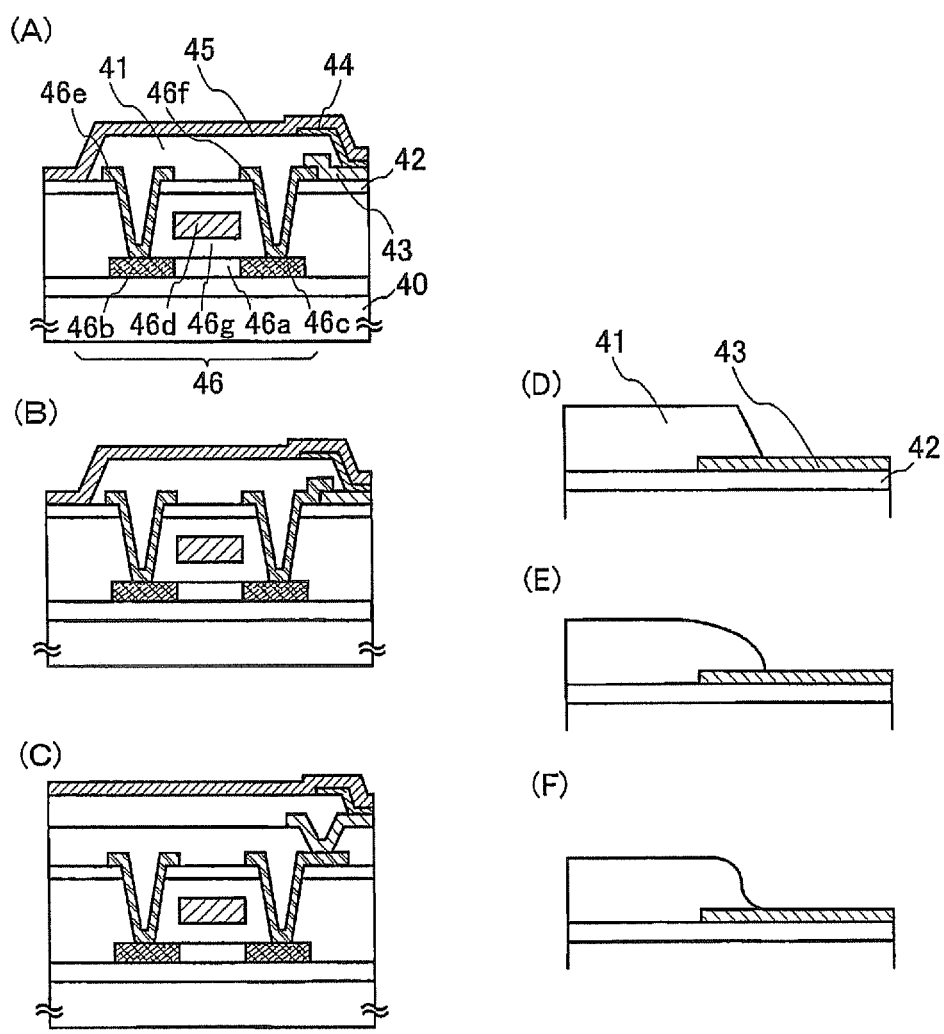
FIG. 10 is a diagram showing a sectional structure of a pixel portion of a light-emitting device. (Embodiment 4)

In FIG. 10(A), reference numeral 40 denotes a substrate, reference numeral 41 denotes a barrier (also referred to as a bank), reference numeral 42 denotes an insulating film, reference numeral 43 is a first electrode (anode), reference numeral 44 is a layer including an organic compound, reference numeral 45 is a second electrode (cathode), and reference numeral 46 is a TFT.

In the TFT 46, reference numeral 46a denotes a channel formation region, reference numerals 46b and 46c denote a source region or a drain region, reference numeral 46d denotes a gate electrode, and reference numerals 46e and 46f denote a source electrode or a drain electrode. Although a top gate TFT is shown here, there is no particular limitation. An inversely staggered TFT may be employed or a staggered TFT may be employed. Note that the reference numeral 46f is an electrode for connecting the TFT 46 to the first electrode 43, which has a portion overlapping in contact with the first electrode 43.

Besides, FIG. 10(B) shows a sectional structure that is partially different from FIG. 10(A).

In FIG. 10(B), the overlap between the first electrode and the electrode is different from the structure of FIG. 10(A). After patterning of the first electrode, the electrode is formed to partially overlap with the first electrode, whereby the first electrode is connected to the TFT.

Besides, FIG. 10(C) shows a sectional structure that is partially different from FIG. 10(A).

In FIG. 10(C), one more interlayer insulating film is further provided, and the first electrode is connected to the electrode of the TFT through a contact hole.

Besides, as a sectional shape of the barrier 41, a tapered shape may be employed as shown in FIG. 10(D), which is obtained by etching a non-photosensitive organic resin film or an inorganic insulating film after exposing resist with photolithography.

Further, when positive photosensitive organic resin is used, a shape as shown in FIG. 10(E), a shape that has an upper edge portion with a curved surface can be obtained.

Further, when negative photosensitive resin is used, a shape as shown in FIG. 10(F), a shape that has an upper edge portion and a lower edge portion with a curved surface can be obtained.

[Embodiment 5]

Implementing the present invention can complete various modules (an active matrix liquid crystal module, an active matrix EL module, and an active matrix EC module). That is to say, by implementing the present invention, all electronic devices with the module mounted are completed.

Figure 11:
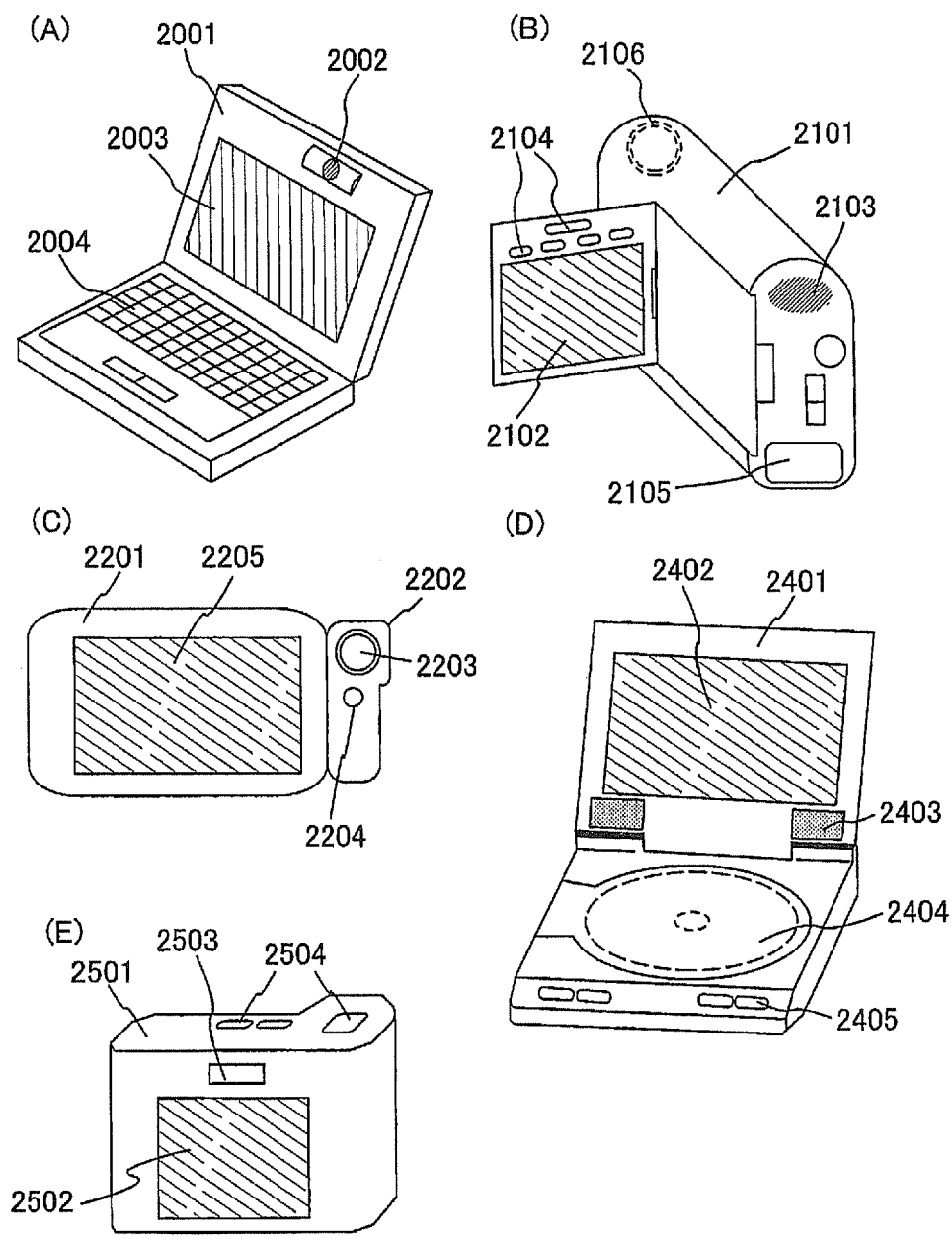
FIG. 11 is a diagram showing examples of electronic devices. (Embodiment 5)
Figure 12:
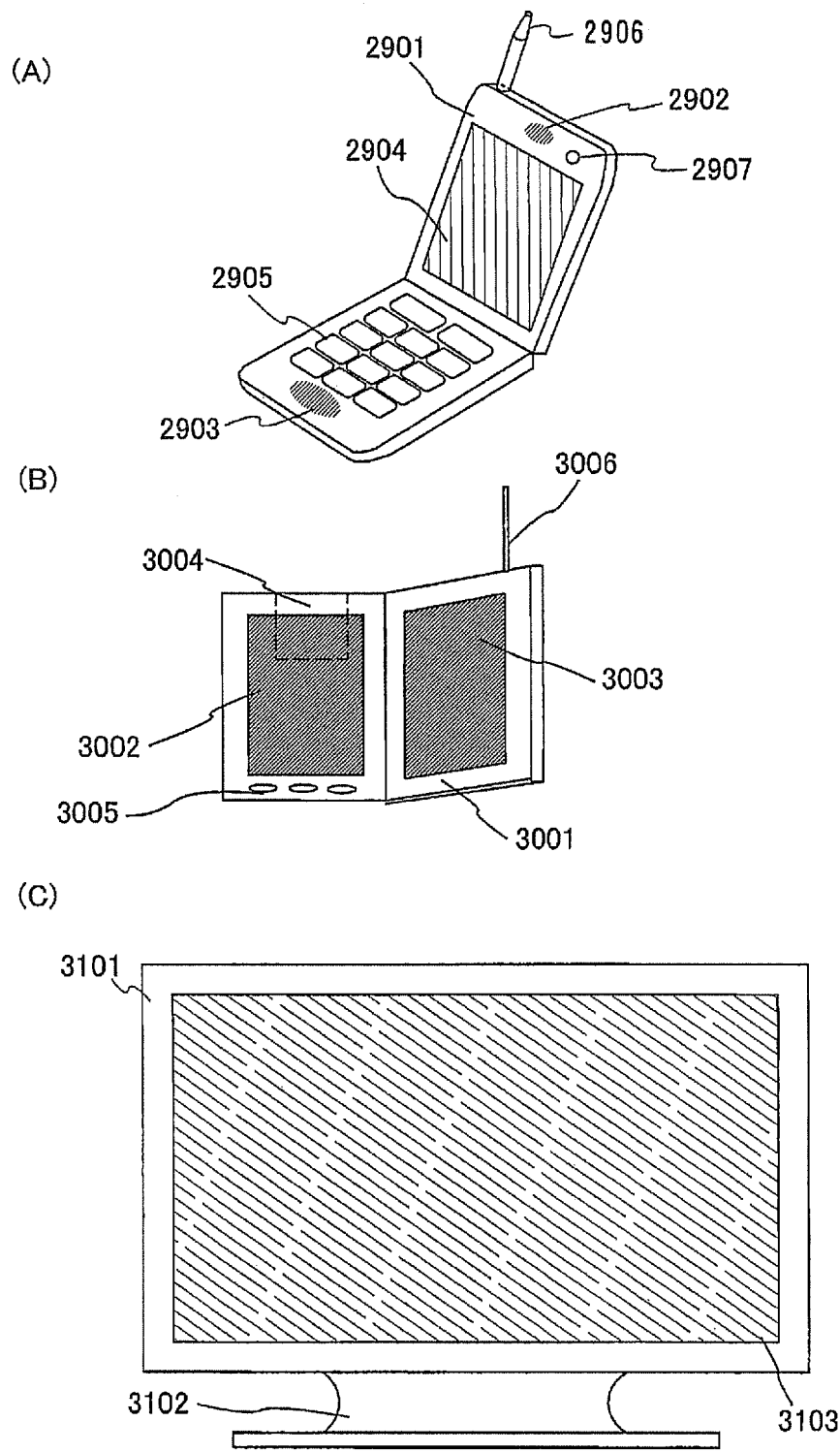
FIG. 12 is a diagram showing examples of electronic devices. (Embodiment 5)

As such electronic devices, a video camera, a digital camera, a head mount display (goggle type display), a car navigation system, a projector, a car stereo, a personal computer, a personal digital assistance (mobile computer, portable telephone or electronic book) and the like are given. FIGS. 11 and 12 show examples thereof.

FIG. 11(A) is a personal computer, which includes a main body 2001, an image input portion 2002, a display portion 2003, and a keyboard 2004.

FIG. 11(B) is a video camera, which includes a main body 2101, a display portion 2102, a voice input portion 2103, an operation switch 2104, a battery 2105, and an image receiving portion 2106.

FIG. 11(C) is a mobile computer, which includes a main body 2201, a camera portion 2202, an image receiving portion 2203, an operation switch 2204, and a display portion 2205.

FIG. 11(D) is a player using a record medium with a program recorded (hereinafter, referred to as a record medium), which includes a main body 2401, a display portion 2402, a speaker portion 2403, a record medium 2404, and an operation switch 2405. Further, this player uses a DVD (Digital Versatile Disc) or a CD as the recording medium, which can be used for listening to music, seeing a movie, playing a game, and using Internet.

FIG. 11(E) is a digital camera, which includes a main body 2501, a display portion 2502, an eye piece 2503, an operation switch 2504, and an image-receiving portion (not illustrated).

FIG. 12(A) is a portable telephone, which includes a main body 2901, a voice output portion 2902, a voice input portion 2903, a display portion 2904, an operation switch 2905, an antenna 2906, and an image input portion (such as a CCD or an image sensor) 2907.

FIG. 12(B) is a portable book (electronic book), which includes a main body 3001, display portions 3002, 3003, a record medium 3004, an operation switch 3005, and an antenna 3006.

FIG. 12(C) is a display, which includes a main body 3101, a support base 3102, and a display portion 3103.

Incidentally, the display shown in FIG. 12(C) has a middle or small size or large type, for example, a screen size of 5 to 20 inches. Further, in order to form the display portion with such a size, it is preferable to use a substrate with a side of 1 m and carry out mass production by taking many faces.

As described above, the present invention is fairly widely applied and is applicable to a manufacturing method of electronic devices in all fields. Further, the electronic devices in the present embodiment can be realized by using any combination of Embodiment Mode and Embodiments 1 to 3.

What is claimed is:

1. A semiconductor device comprising;
   a metal oxide layer in contact with an adhesive over a plastic substrate with an insulating surface,
   an element over the metal oxide layer, and
   a substrate with flexibility over the element,
   wherein the element is at least one of a transistor, an organic light-emitting element, a liquid crystal element, a memory element, a diode, a photoelectric conversion element comprising PIN junction of silicon, and a silicon resistor element, and
   wherein the metal oxide layer is a single layer comprising a metal element selected from Ti, Ta, W, Mo, Cr, Nd, Fe, Ni, Co, Zr, and Zn, or one of an alloy material and a compound material including the metal element as its main component, or a lamination layer thereof.

2. The semiconductor device according to claim 1, wherein the semiconductor device is a video camera, a digital camera, a goggle type display, a car navigation system, a personal computer, or a personal digital assistant.

3. The semiconductor device according to claim 1, wherein the plastic substrate comprises a material selected from the group consisting of polyethylene terephthalate, a polyether sulfone, polyethylene naphthalate, a polycarbonate, a polyether ether ketone, a polysulfone, a polyetherimide, a polyarylate, polybutylene terephthalate, and a polyimide.

4. A semiconductor device comprising;
a metal oxide layer in contact with a first adhesive over a plastic substrate with an insulating surface,
a first element over the metal oxide layer,
a second adhesive over the first element, and
a substrate with flexibility over the second adhesive,
wherein the metal oxide layer is a single layer comprising a metal element selected from Ti, Ta, W, Mo, Cr, Nd, Fe, Ni, Co, Zr, and Zn, or one of an alloy material and a compound material including the metal element as its main component, or a lamination layer thereof.

5. The semiconductor device according to claim 4, wherein the second adhesive is in contact with the first element and the substrate.

6. The semiconductor device according to claim 4, wherein the second adhesive is in contact with a side surface of the first element.

7. The semiconductor device according to claim 4, further comprising a second element over the first element,
wherein the second adhesive is in contact with the first element and the second element.

8. The semiconductor device according to claim 7, wherein the second adhesive is in contact with a side surface of the second element.

9. The semiconductor device according to claim 7,
wherein the first element is a transistor, and
wherein the second element is an organic light-emitting element.

10. The semiconductor device according to claim 4, wherein the plastic substrate comprises a material selected from the group consisting of polyethylene terephthalate, a polyether sulfone, polyethylene naphthalate, a polycarbonate, a polyether ether ketone, a polysulfone, a polyetherimide, a polyarylate, polybutylene terephthalate, and a polyimide.

11. A semiconductor device comprising;
a metal oxide layer in contact with a first adhesive over a plastic substrate with an insulating surface,
a first element over the metal oxide layer, and
a second adhesive over the first element,
wherein the metal oxide layer is a single layer comprising a metal element selected from Ti, Ta, W, Mo, Cr, Nd, Fe, Ni, Co, Zr, and Zn, or one of an alloy material and a compound material including the metal element as its main component, or a lamination layer thereof.

12. The semiconductor device according to claim 11, wherein the second adhesive is in contact with the first element.

13. The semiconductor device according to claim 11, wherein the second adhesive is in contact with a side surface of the first element.

14. The semiconductor device according to claim 11, further comprising a second element over the first element,
wherein the second adhesive is in contact with the first element and the second element.

15. The semiconductor device according to claim 14, wherein the second adhesive is in contact with a side surface of the second element.

16. The semiconductor device according to claim 14,
wherein the first element is a transistor, and
wherein the second element is an organic light-emitting element.

17. The semiconductor device according to claim 11, wherein the plastic substrate comprises a material selected from the group consisting of polyethylene terephthalate, a polyether sulfone, polyethylene naphthalate, a polycarbonate, a polyether ether ketone, a polysulfone, a polyetherimide, a polyarylate, polybutylene terephthalate, and a polyimide.

* * * * *